United States Patent
Swenson

(10) Patent No.: US 12,376,501 B2
(45) Date of Patent: Jul. 29, 2025

(54) KINETIC INDUCTANCE DEVICES, METHODS FOR FABRICATING KINETIC INDUCTANCE DEVICES, AND ARTICLES EMPLOYING THE SAME

(71) Applicant: D-WAVE SYSTEMS INC., Burnaby (CA)

(72) Inventor: Loren J. Swenson, San Jose, CA (US)

(73) Assignee: 1372934 B.C. LTD., Burnaby (CA)

( * ) Notice: Subject to any disclaimer, the term of this patent is extended or adjusted under 35 U.S.C. 154(b) by 449 days.

(21) Appl. No.: 17/923,995

(22) PCT Filed: May 7, 2021

(86) PCT No.: PCT/US2021/031373
§ 371 (c)(1),
(2) Date: Nov. 8, 2022

(87) PCT Pub. No.: WO2021/231224
PCT Pub. Date: Nov. 18, 2021

(65) Prior Publication Data
US 2023/0189665 A1    Jun. 15, 2023

Related U.S. Application Data

(60) Provisional application No. 63/023,048, filed on May 11, 2020.

(51) Int. Cl.
*H10N 60/12*    (2023.01)
*G06N 10/40*    (2022.01)
(Continued)

(52) U.S. Cl.
CPC ............. *H10N 60/12* (2023.02); *G06N 10/40* (2022.01); *H10N 60/0912* (2023.02);
(Continued)

(58) Field of Classification Search
CPC .. H10N 60/12; H10N 60/0912; H10N 60/805; H10N 69/00
See application file for complete search history.

(56) References Cited

U.S. PATENT DOCUMENTS

| | | | |
|---|---|---|---|
| 4,009,479 A | 2/1977 | Cardinne et al. | |
| 4,028,714 A | 6/1977 | Henkels | |

(Continued)

FOREIGN PATENT DOCUMENTS

| | | |
|---|---|---|
| CN | 1471180 A | 1/2004 |
| CN | 101088102 A | 12/2007 |

(Continued)

OTHER PUBLICATIONS

Ex Parte Quayle Issued in U.S. Appl. No. 17/158,484, mailed Jan. 19, 2024, 9 pages.

(Continued)

*Primary Examiner* — Matthew L Reames
(74) *Attorney, Agent, or Firm* — Cozen O'Connor

(57) ABSTRACT

Superconducting integrated circuits and methods of forming these circuits are discussed. One superconducting integrated circuit has a substrate and a control device formed by a layer of high kinetic inductance material overlying the substrate. The control device has a loop of material, electrical connections between the loop of material and a power line, a coupling element connected to the loop of material, a pair of Josephson junctions that interrupt the loop of material, and an energy storage element connected to the loop of material. An alternative superconducting integrated circuit has a kinetic inductance device formed in a high kinetic inductance layer. The device has a compound Josephson junction structure with two parallel current paths with respective Josephson junctions, a loop of material connected to the compound Josephson junction structure, and a coupling (Continued)

structure. The circuit also has an additional device that couples to the coupling structure.

21 Claims, 12 Drawing Sheets

(51) Int. Cl.
*H10N 60/01* (2023.01)
*H10N 60/80* (2023.01)
*H10N 60/85* (2023.01)
*H10N 69/00* (2023.01)

(52) U.S. Cl.
CPC ........... *H10N 60/805* (2023.02); *H10N 60/85* (2023.02); *H10N 69/00* (2023.02)

(56) References Cited

U.S. PATENT DOCUMENTS

| | | |
|---|---|---|
| 4,454,522 A | 6/1984 | De |
| 4,490,733 A | 12/1984 | Kroger |
| 4,554,567 A | 11/1985 | Jillie et al. |
| 4,689,559 A | 8/1987 | Hastings et al. |
| 4,749,888 A | 6/1988 | Sakai et al. |
| 4,912,975 A | 4/1990 | Ohta et al. |
| 5,055,158 A | 10/1991 | Gallagher et al. |
| 5,084,438 A | 1/1992 | Matsubara et al. |
| 5,087,605 A | 2/1992 | Hegde et al. |
| 5,131,976 A | 7/1992 | Hoko |
| 5,157,466 A | 10/1992 | Char et al. |
| 5,250,817 A | 10/1993 | Fink |
| 5,274,249 A | 12/1993 | Xi et al. |
| 5,290,761 A | 3/1994 | Keating et al. |
| 5,307,068 A | 4/1994 | Hartemann |
| 5,323,344 A | 6/1994 | Katayama et al. |
| 5,323,520 A | 6/1994 | Peters et al. |
| 5,339,457 A | 8/1994 | Kawasaki et al. |
| 5,358,928 A | 10/1994 | Ginley et al. |
| 5,514,974 A | 5/1996 | Bouldin |
| 5,548,130 A | 8/1996 | Shimizu et al. |
| 5,627,139 A | 5/1997 | Chin et al. |
| 5,672,212 A | 9/1997 | Manos |
| 5,767,043 A | 6/1998 | Cantor et al. |
| 5,776,863 A | 7/1998 | Silver |
| 5,804,251 A | 9/1998 | Yu et al. |
| 5,846,846 A | 12/1998 | Suh et al. |
| 5,858,106 A | 1/1999 | Ohmi et al. |
| 5,863,868 A | 1/1999 | Chan et al. |
| 5,869,846 A | 2/1999 | Higashino et al. |
| 5,880,069 A | 3/1999 | Nakao et al. |
| 5,892,243 A | 4/1999 | Chan |
| 5,962,865 A | 10/1999 | Kerber et al. |
| 5,962,866 A | 10/1999 | Diiorio et al. |
| 6,011,981 A | 1/2000 | Alvarez et al. |
| 6,133,635 A | 10/2000 | Bothra et al. |
| 6,165,801 A | 12/2000 | Burns et al. |
| 6,188,919 B1 | 2/2001 | Lagraff et al. |
| 6,242,387 B1 | 6/2001 | Cukauskas et al. |
| 6,284,721 B1 | 9/2001 | Lei |
| 6,362,638 B1 | 3/2002 | Ashton et al. |
| 6,384,423 B1 | 5/2002 | Kerber et al. |
| 6,384,424 B1 | 5/2002 | Kugai et al. |
| 6,420,189 B1 | 7/2002 | Lopatin |
| 6,459,097 B1 | 10/2002 | Zagoskin |
| 6,476,413 B1 | 11/2002 | Jia et al. |
| 6,495,854 B1 | 12/2002 | Newns et al. |
| 6,517,944 B1 | 2/2003 | Puzey et al. |
| 6,518,673 B2 | 2/2003 | Herr et al. |
| 6,541,789 B1 | 4/2003 | Sato et al. |
| 6,563,311 B2 | 5/2003 | Zagoskin |
| 6,569,252 B1 | 5/2003 | Sachdev et al. |
| 6,624,122 B1 | 9/2003 | Holesinger et al. |
| 6,627,915 B1 | 9/2003 | Ustinov et al. |
| 6,715,944 B2 | 4/2004 | Oya et al. |
| 6,753,546 B2 | 6/2004 | Tzalenchuk et al. |
| 6,767,840 B1 | 7/2004 | Uehara et al. |
| 6,803,599 B2 | 10/2004 | Amin et al. |
| 6,849,557 B1 | 2/2005 | Ko |
| 6,882,293 B2 | 4/2005 | Shoji et al. |
| 6,905,887 B2 | 6/2005 | Amin et al. |
| 6,936,808 B2 | 8/2005 | Uchida |
| 6,979,836 B2 | 12/2005 | Zagoskin et al. |
| 7,091,132 B2 | 8/2006 | Tan et al. |
| 7,135,701 B2 | 11/2006 | Amin et al. |
| 7,418,283 B2 | 8/2008 | Amin |
| 7,533,068 B2 | 5/2009 | Maassen et al. |
| 7,619,437 B2 | 11/2009 | Thom et al. |
| 7,624,088 B2 | 11/2009 | Johnson et al. |
| 7,638,434 B2 | 12/2009 | Helneder |
| 7,639,035 B2 | 12/2009 | Berkley |
| 7,675,139 B2 | 3/2010 | Nomura et al. |
| 7,687,938 B2 | 3/2010 | Bunyk et al. |
| 7,843,209 B2 | 11/2010 | Berkley |
| 7,876,248 B2 | 1/2011 | Berkley et al. |
| 7,898,282 B2 | 3/2011 | Harris et al. |
| 7,981,759 B2 | 7/2011 | Cervin-Lawry et al. |
| 7,990,662 B2 | 8/2011 | Berkley et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,169,231 B2 | 5/2012 | Berkley |
| 8,173,228 B2 | 5/2012 | Choi et al. |
| 8,190,548 B2 | 5/2012 | Choi |
| 8,195,596 B2 | 6/2012 | Rose et al. |
| 8,283,943 B2 | 10/2012 | Van Den Brink et al. |
| 8,301,214 B1 | 10/2012 | Tolpygo et al. |
| 8,421,053 B2 | 4/2013 | Bunyk et al. |
| 8,437,818 B1 | 5/2013 | Tolpygo et al. |
| 8,441,330 B2 | 5/2013 | Uchaykin |
| 8,536,566 B2 | 9/2013 | Johansson et al. |
| 8,571,614 B1 | 10/2013 | Mukhanov et al. |
| 8,611,974 B2 | 12/2013 | Maibaum et al. |
| 8,644,898 B1 | 2/2014 | De Andrade et al. |
| 8,742,594 B2 | 6/2014 | Daubenspeck et al. |
| 8,854,074 B2 | 10/2014 | Berkley |
| 8,933,695 B1 | 1/2015 | Kornev et al. |
| 8,951,808 B2 | 2/2015 | Ladizinsky et al. |
| 9,130,116 B1 | 9/2015 | Tolpygo et al. |
| 9,136,457 B2 | 9/2015 | Tolpygo |
| 9,183,508 B2 | 11/2015 | King |
| 9,324,767 B1 | 4/2016 | Steinbach et al. |
| 9,355,362 B2 | 5/2016 | Shea et al. |
| 9,490,296 B2 | 11/2016 | Ladizinsky et al. |
| 9,495,644 B2 | 11/2016 | Chudak et al. |
| 9,520,180 B1 | 12/2016 | Mukhanov et al. |
| 9,564,573 B1 | 2/2017 | Chang et al. |
| 9,634,224 B2 | 4/2017 | Ladizinsky et al. |
| 9,768,371 B2 | 9/2017 | Ladizinsky et al. |
| 9,836,699 B1 | 12/2017 | Rigetti et al. |
| 9,971,970 B1 | 5/2018 | Rigetti et al. |
| 9,978,809 B2 | 5/2018 | Ladizinsky et al. |
| 10,134,972 B2 | 11/2018 | Oliver et al. |
| 10,141,493 B2 | 11/2018 | Tuckerman |
| 10,290,425 B2 | 5/2019 | Shindo et al. |
| 10,355,193 B2 | 7/2019 | Rosenblatt et al. |
| 10,381,541 B2 | 8/2019 | Das et al. |
| 10,424,711 B2 | 9/2019 | Schoelkopf et al. |
| 10,454,015 B2 | 10/2019 | Lanting et al. |
| 10,468,740 B2 | 11/2019 | Minev et al. |
| 10,528,886 B2 | 1/2020 | Boothby |
| 10,658,424 B2 | 5/2020 | Oliver et al. |
| 10,938,346 B2 | 3/2021 | Berkley et al. |
| 11,038,095 B2 | 6/2021 | Huang et al. |
| 11,100,416 B2 | 8/2021 | Lanting et al. |
| 11,105,866 B2 | 8/2021 | Swenson et al. |
| 11,121,301 B1 | 9/2021 | Marshall et al. |
| 11,127,893 B2 | 9/2021 | Johnson et al. |
| 11,295,225 B2 | 4/2022 | Hoskinson et al. |
| 12,034,404 B2 | 7/2024 | Berkley et al. |
| 2001/0004479 A1 | 6/2001 | Cheung et al. |
| 2001/0020701 A1 | 9/2001 | Zagoskin |
| 2002/0017906 A1 | 2/2002 | Ho et al. |
| 2002/0117738 A1 | 8/2002 | Amin et al. |

(56) References Cited

U.S. PATENT DOCUMENTS

| | | |
|---|---|---|
| 2002/0180006 A1 | 12/2002 | Franz et al. |
| 2002/0188578 A1 | 12/2002 | Amin et al. |
| 2002/0190343 A1 | 12/2002 | Jones et al. |
| 2002/0190381 A1 | 12/2002 | Herr et al. |
| 2003/0027724 A1 | 2/2003 | Rose et al. |
| 2003/0068832 A1 | 4/2003 | Koval et al. |
| 2003/0089987 A1 | 5/2003 | Parikh |
| 2003/0102470 A1 | 6/2003 | Il et al. |
| 2003/0107033 A1 | 6/2003 | Tzalenchuk et al. |
| 2003/0193097 A1 | 10/2003 | Il et al. |
| 2003/0203639 A1 | 10/2003 | Ko et al. |
| 2004/0077504 A1 | 4/2004 | Adachi et al. |
| 2004/0087081 A1 | 5/2004 | Aitchison et al. |
| 2004/0155237 A1 | 8/2004 | Kerber |
| 2004/0191697 A1 | 9/2004 | Nakatsuka et al. |
| 2004/0266209 A1 | 12/2004 | Hinode et al. |
| 2005/0029512 A1 | 2/2005 | Hato et al. |
| 2005/0062131 A1 | 3/2005 | Murduck et al. |
| 2005/0087893 A1 | 4/2005 | Chung et al. |
| 2005/0107261 A1 | 5/2005 | Cantor et al. |
| 2005/0251990 A1 | 11/2005 | Choi et al. |
| 2006/0197193 A1 | 9/2006 | Gu et al. |
| 2007/0077765 A1 | 4/2007 | Prince et al. |
| 2007/0123040 A1 | 5/2007 | Hwang et al. |
| 2008/0001699 A1 | 1/2008 | Gardner et al. |
| 2008/0070325 A1 | 3/2008 | Tolpygo |
| 2009/0033353 A1 | 2/2009 | Yu et al. |
| 2009/0078931 A1 | 3/2009 | Berkley |
| 2009/0203192 A1 | 8/2009 | Kaltalioglu et al. |
| 2009/0312186 A1 | 12/2009 | Norem et al. |
| 2009/0317958 A1 | 12/2009 | Tang et al. |
| 2009/0319757 A1 | 12/2009 | Berkley |
| 2011/0022820 A1 | 1/2011 | Bunyk et al. |
| 2011/0065586 A1 | 3/2011 | Maibaum et al. |
| 2011/0089405 A1 | 4/2011 | Ladizinsky et al. |
| 2011/0095435 A1 | 4/2011 | Volant et al. |
| 2012/0319211 A1 | 12/2012 | Van Dal et al. |
| 2013/0116159 A1 | 5/2013 | Pollard et al. |
| 2014/0111242 A1 | 4/2014 | Xie et al. |
| 2015/0032994 A1 | 1/2015 | Chudak et al. |
| 2015/0046681 A1 | 2/2015 | King |
| 2015/0119252 A1 | 4/2015 | Ladizinsky et al. |
| 2015/0119253 A1 | 4/2015 | Yohannes et al. |
| 2015/0219730 A1 | 8/2015 | Tsukamoto et al. |
| 2015/0236235 A1 | 8/2015 | Ladizinsky et al. |
| 2015/0372217 A1 | 12/2015 | Schoelkopf et al. |
| 2016/0079968 A1 | 3/2016 | Strand et al. |
| 2016/0170675 A1 | 6/2016 | Pickerell et al. |
| 2018/0053689 A1 | 2/2018 | Kirby et al. |
| 2018/0145631 A1 | 5/2018 | Berkley et al. |
| 2018/0219150 A1 | 8/2018 | Lanting et al. |
| 2018/0308896 A1 | 10/2018 | Ladizinsky et al. |
| 2018/0337138 A1 | 11/2018 | Luu et al. |
| 2019/0019099 A1 | 1/2019 | Hoskinson et al. |
| 2019/0044044 A1 | 2/2019 | Lampert et al. |
| 2019/0044048 A1 | 2/2019 | George et al. |
| 2019/0044051 A1 | 2/2019 | Caudillo et al. |
| 2019/0164959 A1 | 5/2019 | Thomas et al. |
| 2019/0288176 A1 | 9/2019 | Yoscovits et al. |
| 2019/0332965 A1 | 10/2019 | Barends |
| 2019/0369171 A1 | 12/2019 | Swenson et al. |
| 2020/0012961 A1 | 1/2020 | Kelly et al. |
| 2020/0144476 A1 | 5/2020 | Huang et al. |
| 2020/0152851 A1 | 5/2020 | Lanting et al. |
| 2020/0266234 A1 | 8/2020 | Boothby et al. |
| 2020/0287118 A1 | 9/2020 | Herr et al. |
| 2021/0190885 A1 | 6/2021 | Swenson et al. |
| 2021/0375516 A1 | 12/2021 | Sterling et al. |
| 2022/0123048 A1 | 4/2022 | Swenson et al. |
| 2023/0004851 A1 | 1/2023 | Harris et al. |
| 2023/0101616 A1 | 3/2023 | Volkmann et al. |
| 2023/0400510 A1 | 12/2023 | Whittaker et al. |

FOREIGN PATENT DOCUMENTS

| | | |
|---|---|---|
| CN | 102334206 A | 1/2012 |
| CN | 105914219 A | 8/2016 |
| EP | 0329603 A2 | 8/1989 |
| EP | 0437971 A1 | 7/1991 |
| EP | 0466611 A1 | 1/1992 |
| EP | 0476844 A1 | 3/1992 |
| EP | 0477495 A1 | 4/1992 |
| EP | 0732756 A2 | 9/1996 |
| EP | 0756335 A1 | 1/1997 |
| EP | 2401776 B1 | 8/2016 |
| JP | S60140885 A | 7/1985 |
| JP | S6215869 A | 1/1987 |
| JP | S6257263 A | 3/1987 |
| JP | S62200777 A | 9/1987 |
| JP | 63007675 A | 1/1988 |
| JP | S637675 A | 1/1988 |
| JP | S63226981 A | 9/1988 |
| JP | S6411357 U | 1/1989 |
| JP | S6476610 A | 3/1989 |
| JP | H027583 A | 1/1990 |
| JP | H03286578 A | 12/1991 |
| JP | H04246871 A | 9/1992 |
| JP | H04334074 A | 11/1992 |
| JP | H05102547 A | 4/1993 |
| JP | H05114756 A | 5/1993 |
| JP | H06260692 A | 9/1994 |
| JP | 08255937 | 1/1995 |
| JP | H07066462 A | 3/1995 |
| JP | H07245404 A | 9/1995 |
| JP | H08236823 A | 9/1996 |
| JP | H104223 A | 1/1998 |
| JP | 2001516970 A | 10/2001 |
| JP | 2001516970 T | 10/2001 |
| JP | 2003092436 A | 3/2003 |
| JP | 2004-079882 | 3/2004 |
| JP | 2004079882 A | 3/2004 |
| JP | 2004128437 A | 4/2004 |
| JP | 2004519102 A | 6/2004 |
| JP | 2005-39244 A | 2/2005 |
| JP | 2005039244 A | 2/2005 |
| JP | 2007150257 A | 6/2007 |
| JP | 2009111306 A | 5/2009 |
| JP | 2012519379 A | 8/2012 |
| JP | 6059754 B2 | 12/2016 |
| KR | 20000026669 A | 5/2000 |
| KR | 20010067425 A | 7/2001 |
| KR | 20190035900 A | 4/2019 |
| WO | 99/14800 A1 | 3/1999 |
| WO | 0201327 A2 | 1/2002 |
| WO | 02069411 A2 | 9/2002 |
| WO | 2005093649 A1 | 10/2005 |
| WO | 2007085074 A1 | 8/2007 |
| WO | 2008138150 A1 | 11/2008 |
| WO | 2009120638 A2 | 10/2009 |
| WO | 2009149086 A2 | 12/2009 |
| WO | 2013180780 A2 | 12/2013 |
| WO | 2016025598 A1 | 2/2016 |
| WO | 2016183213 A1 | 11/2016 |
| WO | 2017192733 A2 | 11/2017 |
| WO | 2018144601 A1 | 8/2018 |
| WO | 2019055002 A1 | 3/2019 |
| WO | 2019179732 A1 | 9/2019 |
| WO | 2020212437 A1 | 10/2020 |
| WO | 2021231224 A1 | 11/2021 |
| WO | 2021262741 A1 | 12/2021 |
| WO | 2022178130 A1 | 8/2022 |
| WO | 2024102504 A2 | 5/2024 |

OTHER PUBLICATIONS

Ramos et al., "Design for Effective Thermalization of Junctions for Quantum Coherence," IEEE Transactions on Applied Superconductivity 11(1):998-1001, Mar. 2001.

Bronn, et al., "High Coherence Plane Breaking Packaging for Superconducting Qubits", arXiv:1709.02402v2 [quant-ph] Feb. 14, 2018, 101 pages.

(56) References Cited

OTHER PUBLICATIONS

Chapter: Appendix C: Superconducting Quantum Computers, Quantum, Computing Progress and Prospects, the National Academies Press, 2019, 10 pages.
Chen et al., "Qubit architecture with high coherences and fast tunable coupling", Physical Review Letters, Feb. 28, 2014. https://arxiv.org/abs/1402.7367.
DeGraaf, et al., "Suppression of low-frequency charge noise in superconducting resonators by surface spin desorption", Supplementary Information, 8 pages.
Elsherbini, et al., "Flip Chip Packaging for Superconducting Quantum Computers", APS—APS March Meeting 2018—Event—vol. 63, No. 1, 1 page.
Fourie, et al., "Wk2EOr3B-05—Experimental verification of moat design and flux trapping analysis", Stellenbosch University, ASC 2020, Virtual Conference, Nov. 4, 2020.
Foxen, et al., Qubit compatible superconducting interconnects, arXiv:1708.04270v2 [quant-ph], Sep. 29, 2017, 19 pages.
Fritz, et al., "Optimization of Al/AlOx/Al-layer systems for Josephson Junctions from a microstructure point of view", Journal of Applied Physics, 125, 165301 (2019). 11 pages.
Gargiulo, et al., "Fast flux control of 3D transmon qubits using a magnetic hose", : Appl. Phys. Lett. 118, 012601 (2021); https://doi.org/10.1063/5.0032615, 7 pages.
Hilton, et al., "Fabrication of prototype imaging arrays for SCUBA-2", Preprint submitted to Elsevier Science, Oct. 3, 2005.
Hsu_"CES 2018 Inte'ls 49-Qubit Chip Shoots for Quantum Supremacy", IEEE Spectrum, 4 pages.
Kamal., et al., "Improved superconducting qubit coherence with high-temperature substrate annealing", arXiv:1606.09262v1 [cond-mat.mes-hall] Jun. 29, 2016, 10 pages.
Koch, et al., "Charge-insensitive qubit design derived from the Cooper pair box", Physical Review A 76, 042319 (2007), 19 pages.
Lei, et al., "High coherence superconducting microwave cavities with indium bump bonding", Appl. Phys. Lett. 116, 154002 (2020), 6 pages.
MIT, "Superconducting Integrated Circuits", Lincoln Laboratory, Technology in Support of National Security, 2 pages.
Narayana, et al., "Design and testing of high-speed interconnects for Superconducting multi-chip modules", MIT Lincoln Laboratory, 244 Wood Street, 2012, 16 pages.
Nguyen et al., "The high-coherence fluxonium qubit", arXiv:1810.11006v1, Oct. 25, 2018.
Rich, "DC Squid Magnetometry", Christopher Bennett Rich 2019 Thesis, Simon Fraser University Fall 2019, 58 pages.
Rosenberg, et al., "3D integrated superconducting qubits", arXiv:1706.04116v2 [quant-ph] Jun. 19, 2017, 6 pages.
Sharma, "Fabrication and Characterization of AL/ALOx/AL Josephson Junctions", Mater of Science, Texas A&M University, Dec. 2015, 84 pages.
Shen, et al., "Character and fabrication of Al/al2o3/al tunnel junctions for qubit application", Chinese Science Bulletin, Feb. 2012 Vo. 57 No. 4: 409-412.
Simmonds, et al., "Josephson Junction Materials Research Using Phase Qubits".
Steffen, et al., "Recent research trends for high coherence quantum circuits", IOP Publishing, Supercond. Sci. Technol, 30 (2017), 5 pages.
Tennant, et al., "Low frequency correlated charge noise measurements across multiple energy transitions in a tantalum transmon", arXiv:2106.08406v1 [quant-ph] Jun. 15, 2021.
Tolpygo, et al., "Process-Induced Variability of Nb/Al/Alox/Nb Junctions in Superconductor Integrated Circuits and Protection Against It", IEEE Transactions on Applied Superconductivity, vol. 19, No. 3, Jun. 2009, 5 pages.
Toplygo, et al., "Wafer Bumping Process and Inter-Chip Connections for Ultra-High Data Transfer Rates in Multi-Chip Modules With Superconductor Integrated Circuits", IEEE Transactions on Applied Superconductivity, 2009, 5 pages.
Tournet, "Growth and Characterization of Epitaxial Al Layers on GaAs and Si Substrates for Superconducting CPW Resonators in Scalable Quantum Computing Systems", Thesis 2015, 161 pages.
Weides, et al., "Phase qubits fabricated with trilayer junctions", 7 pages.
Non Final Office Action for U.S. Appl. No. 17/681,303, mailed May 17, 2023, 13 pages.
Racah et al., "Properties of normal metal/dielectric/high-Tcjunctions obtained by in-situ oxidation", Physica C 263, 1996.
Chinese Office Action dated Mar. 30, 2023, for Chinese Application No. 201880021010X, 12 pages (English translation of action).
Anton, et al., "Magnetic Flux Noise in dc SQUIDs: Temperature and Geometry Dependence", Physical Review Letters, PRL 110, 147002, Apr. 5, 2013.
B. H. Eom et al., "Wideband, Low-Noise Superconducting Amplifier with High Dynamic Range", arXiv:1201.2392v1 [cond-mat.supr-con], 2012, 23 pages.
Barends R. Enhancement of Quasiparticle Recombination in Ta and Al Superconductors by Implantation of Magnetic and Nonmagnetic Atoms (2009).
Brecht, et al., "Multilayer Microwave Integrated Quantum Circuits for Scalable Quantum Computing", npj Quantum Information (2016) 16002.
Calota, et al., "Investigation of Chemical/Mechanical Polishing of Niobium", , STLE Tribology Transactions, vol. 52(4), p. 447-459, 2009.
Campbell, Wafer-Level Electrically Detected Magnetic Resonance: Magnetic Resonance in a Probing Station (2018).
De Graaf, Supplementary Information, Suppression of low-frequency charge noise in superconducting resonators by surface spin desorption, Nature Communications ( 2019).
Geerlings, "Improving Coherence of Superconducting Qubits and Resonators", A Dissertation Presented to the Faculty of the Graduate School of Yale University, 2012.
Harris et al., "Experimental Demonstration of a Robust and Scalable Flux Qubit," arXiv:0909.4321v1, Sep. 24, 2009, 20 pages.
Johnson et al., "Scalable Control System for a Superconducting Adiabatic Quantum Optimization Processor," arXiv:0907.3757v2. Mar. 24, 2010. 14 pages.
Kelly, et al., "Fault-tolerant Superconducting Qubits, Dissertations in fulfilment of Ph.D. in Physics", UC Santa Barbara, 2015.
Kosen, et al., "Signal Crosstalk in a Flip-Chip Quantum Processor", PRX Quantum 5, 030350 (2024).
Majer, J.B., "Superconducting Quantum Circuits," Thesis, published by DUP Science, Dec. 13, 2002, 120 pages.
Niepce, "Fabrication and Characterisation of Thin-Film Superconducting Nanowire Superconductors for Novel Quantum Devices", Master's Thesis in Nanoscience, Chalmers University of Technology, ISSN 1652-8557, 2014, 66 pages.
Sendelbach, et al., "Complex Inductance, Excess Noise, and Surface Magnetism in dc SQUIDs", Physical Review Letters 103, 117001, Sep. 11, 2009.
Sun, Self-Aligned 3D Chip Integration Technology and Through-Silicon Serial Data Transmission (2011).
Tafuri, Feasibility of Biepitaxial YbaCuO Josephson Junctions for Fundamental Studies and Potential Circuit Implementation, Los Alamos National Laboratory preprint server condmat, 21 pages. Oct. 9, 2000.
Tezcan, Sloped Throught Wafer Vias for 3D Wafer Level Packaging (2007).
Wu Banqiu, High Aspect Ratio Silicon Etch: A Review (2010).
Yoon, K., et al. "Atomic-Scale Chemical Analyses of Niobium Oxide/Niobium Interfaces via Atom-Probe Tomography," Applied Physics Letters, vol. 93, 2008, 3 pages.
Yorozu, et al., "Sub-Kelvin Single Flux Quantum Control Circuits and Multi-chip Packaging for Supporting Superconducting Qubit", Journal of Physics: Conference Series 43 (2006) 1417-1420.
D-Wave Whitepaper, Early Progress on Lower Noise, 2022.
Fritzsch et al., "SNS and SIS Josephson junctions with dimensions down to the sub-um region prepared by an unified technology," Supercond. Sci. Tech. 12: 880-882, 1999.
Gao et al., A Semiempirical Model For Two Level System Noise In Superconducting Microresonators, Applied Physics, 2008.

(56) References Cited

OTHER PUBLICATIONS

International Search Report and Written Opinion, mailed Oct. 13, 2021. for PCT/US2021/038519, 9 pages.
Kauppinen, et al., "Coulomb Blockade Thermometer: Tests and Instrumentation", Review of Scientific Instruments, vol. 69, #12, 1998.
Kosen, et al., "Building Blocks of a Flip Chip Integrated Superconducting Quantum Processor", arXiv 2112.02717v2, 2022.
Lee, "The Feasibility of Au Bonding on SN-Plated Cu", Journal of Electronic Materials, 2007.
Logothetidis, et al., "Room Temperature Oxidation Behavior of TiN Thin Films", 1999.
Luo, "Superconductivity In Noble-Metal-Rich Hexagonal Close-Packed Phases", 1970.
McCrory, et al., "Wafer-Level Electrically Detected Magnetic Resonance: Magnetic Resonance In A Probing Station", 2018.
Mcintyre, "The Effect Of Annealing And Heating Deposition On Alpha And Beta Phase Formation For Tantalum Thin Films", 2018.
Narkowicz, et al., "Planar Microresonators For EPR Experiments", Science Direct, 2005.
Ni, et al., "Demonstration Of Tantalum As A Structural Material For MEMS Thermal Actuators", 2021.
Non-Final Office Action Issued in U.S. Appl. No. 16/870,537, mailed Jul. 19, 2023, 9 pages.
Shoji et al., "New fabrication process for Josephson tunnel junctions with (niobium nitride, niobium) double-layered electrodes," Appl. Phys. Lett. 41(11): 1097-1099, Dec. 1, 1982.
Veinger, "Technique For Magnetic Susceptibility Determination in the High Doped Semiconductors by Electron Spin Resonance", 2013.
Vladoiu, "Growth and Characteristics of Tantalum Oxide Thin Films Deposited Using Thermionic Vacuum Arc Technology", 2010.
Wang, "Towards Practical Quantum Computers: Transmon Qubit With a Lifetime Approaching 0.5 Milliseconds", 2022.
Zednicek, "Niobium and Niobium Oxide Capacitors Overview", 2019.
Zhang, et al., "Characterization of Surface Oxidation Layers On Ultrathin NvTIN Films", 2018.
Wang, "Inductance Analysis of Superconducting Quantum Interference Devices with 3D Nano-bridge Juctions", Superconding Science and Technology 31 (2018) 055015, pp. 1-5.
Campbell, et al., "Electron Spin Resonance Scanning Probe Spectroscopy for Ultrasensitive Biochemical Studies", Analytical Chemistry Publications, Anal. Chem. 2015, 87, 4910-4915, 7 pages.
Dhakal, et al., "Flux expulsion in niobium superconducting radio-frequency cavities of different purity and essential contributions in the flux sensitivity", arXiv:1906.04163, Pub. Jun. 6, 2019.
Henry, et al., "Degradation of Superconducting Nb/NbN Films by Atmospheric Oxidation", IEEE Transactions on Applied Superconductivity, IEEXplore, 1051-8223, 2017, 5 pages.
Hu, "Advanced Composites Material" pp. 197-201—Chinese, 2019.
Martinis, et al., "Decoherence in Josephson Qubits from Dielectric Loss", arXiv:cond-mat/0507622v1 [cond-mat.mtrl-sci] Jul. 26, 2005.
Semenov, et al., "How Moats Protect Superconductor Films from Flux Trapping", IEEE Transactions on Applied Superconductivity, 1051-8223, 2016 IEEE, 20 pages.
Semenov., "AC-Biased Shift Registers as Fabrication Process Benchmark Circuits and Flux Trapping Diagnostic Tool", arXiv:1701.03837, Published Dec. 29, 2016, 9 pages.
Non Final Office Action for U.S. Appl. No. 17/429,456, mailed Dec. 27. 2023, 23 pages.
Notice of Allowance for U.S. Appl. No. 17/321,819, mailed Nov. 8, 2023, 10 pages.
Muller et al., "Towards understanding two-level-systems in amorphous solids—Insights from quantum circuits", arXiv:1705.01108v3, Oct. 10, 2019.
Makhlin et al., "Quantum-state engineering with Josephson-junction devices," Reviews of Modern Physics 73(2):357-400, Apr. 2001.

Malissa et al., "Superconducting coplanar waveguide resonators for low temperature pulsed electron spin resonance spectroscopy", Review of Scientific Instruments, Feb. 1, 2013.
Martens et al., "Sparameter measurements on singe superconducting thin-film three-terminal devices made of high-Tc and low-Tc materials", J. Appl. Phys. 65, 1989.
Mason, "Surface Impedance of Thin Superconducting Films", California Institute of Technology, 1962.
McRae et al., "Materials loss measurements using superconducting microwave resonators", arXiv:2006.04718 [physics, physics:quant-ph], Sep. 1, 2000.
Mooij et al., "Josephson Persistent-Current Qubit," Science 285:1036-1039, Aug. 13, 1999.
Morton & Bertet, "Storing quantum information in spins and high-sensitivity ESR", Journal of Magnetic Resonance, 287:128-139, Feb. 1, 2018.
N/A, "Antifuse", Wikipedia, Nov. 16, 2019.
N/A, "Low-k dielectric", Wikipedia, Apr. 14, 2020.
Niepce et al., "Geometric scaling of two-level-system loss in superconducting resonators", Superconducting Science and Technology, 33(2):025013, Jan. 1, 2020.
NSA, "Superconducting Technology Assessment", National Security Agency Office of Corporate Assessments, Aug. 1, 2005, 257 pages.
Office Action in Application No. 2019-562235, mailed Mar. 11, 2022 (English translation, 5 pages).
Oliver et al., "MRS Bulletin" vol. 38, pp. 816-825 (2013).
Peltonen, J.T., et al., "Hybrid rf SQUID qubit based on high kinetic inductance," Scientific Reports, Jul. 3, 2018, 8 pages.
Place et al., "New material platform for superconducting transmon qubits with coherence times exceeding 0.3 milliseconds", arXiv, Feb. 28, 2020.
Place et al., "Supplementary Materials for New material platform for superconducting transmon qubits with coherence times exceeding 0.3 milliseconds", Feb. 1, 2021.
Ramzi et al., "Niobium and Aluminum Josephson Junctions Fabricated with a Damascene CMP Process", Physics Procedia, vol. 36, 2012, p. 211-216.
Schulz et al., "Design and realization of an all d-wave do pi-superconducting quantum interference device", Appl. Phys. Lett. 76, 2000.
Schuster et al., "High cooperativity coupling of electron-spin ensembles to superconducting cavities", Physical Review Letters, 105(14):140501, Sep. 1, 2010.
Sears, "Extending Coherence in Superconducting Qubits: from microseconds to milliseconds", PHD thesis, Yale, Jan. 1, 2013.
Sigillito et al., "Fast, low-power manipulation of spin ensembles in superconducting microresonators", Applied Physics Letters, 104(22):222407, Jun. 1, 2014.
Sun et al., "Direction of tunneling in Pb/ I /YBa2Cu3O7-x tunnel junctions", Phys Rev B 54, 1996.
Swenson et al., "Operation of a titanium nitride superconducting microresonator detector in the nonlinear regime," arXiv:1305.4281v1 [cond-mat.supr-con], May 18, 2013, 11 pages.
Tokunaga et al., "SiO2 passivation film effects on YBCO junctions", Science Direct, Sep. 10, 1998.
Tolpygo et al., "Advanced Fabrication Processes for Superconducting Very Large Scale Integrated Circuits," IEEE Transactions on Applied Superconductivity 26(3):1-10, Jan. 19, 2016.
Tolpygo et al., "Deep sub-micron stud-via technology of superconductor VLSI circuits," Supercond. Sci. Technol. 27:1-9, Jan. 14, 2014.
Valles et al., "Electron tunneling into single crystals of YBa2Cu3O7-δ", Phys. Rev. B 44, 1991.
Verjauw et al., "Investigation of microwave loss induced by oxide regrowth in high-Q Nb resonators", Physical Review Applied, p. 16, Jan. 1, 2020.
VLSI-expert.com, "Parasitic Interconnected Corner (RC corner) Basics—Part 1", hhtp:www.visi-expert.com/2012/02/parasitic-interconnected-corner-rc-corner.html, Feb. 12, 2012 (Year:2012), 7 pages.
Voesch et al., "On-Chip ESR Measurements of DPPH at mK Temperatures", Physics Procedia, 75:503-510, Jan. 1, 2015.

(56) References Cited

OTHER PUBLICATIONS

Voss et al., "Submicron Nb-Al-oxide-Nb junctions for frequency mixers", Superconductor Science and Technology 6, 1993.
Wallace & Silsbee, "Microstrip resonators for electron-spin resonance", Review of Scientific Instruments, 62(7):1754-1766, Jul. 1, 1991.
Wang et al., "FTIR Characterization of Fluorine Doped Silicon Dioxide Thin Films Deposited by Plasma Enhanced Chemical Vapor Deposition", IOP Science, Apr. 21, 2000.
Weichselbaumer et al., "Quantitative modeling of superconducting planar resonators with improved field homogeneity for electron spin resonance", Physical Review Applied, 12(2):024021, Aug. 1, 2019.
Winkel, "Implementation of a transmon qubit using superconducting granular aluminum", arXiv, Nov. 7, 2019.
Woods et al., "Determining interface dielectric losses in superconducting coplanar waveguide resonators", arXiv:1808.10347 [cond-mat,physics:quant-ph], Aug. 1, 2018.
Written Opinion for PCT/US2018/016237, mailed Jul. 2, 2018, 30 pages.
Written Opinion for PCT/US2020/018137, mailed Jun. 3, 2020, 10 pages.
Tolpygo, Sergey K., et al., "Superconductor Electronics Fabrication Process with MoNx Kinetic Inductors and Self-Shunted Josephson Junctions," IEEE Transactions on Applied Superconductivity 28(4), Jun. 2018, 12 pages.
Whittaker, J.D. , et al., "A frequency and sensitivity tunable microresonator array for high-speed quantum," arXiv:1509.05811v2 [quant-ph], Apr. 22, 2016, 8 pages., Apr. 22, 2016.
Barends, et al., "Superconducting quantum circuits at the surface code threshold for fault tolerance", Nature vol. 508, pp. 500-503 (2014).
Blatter et al., "Design aspects of superconducting-phase quantum bits," Physical Review 8 63: 174511-1-174511-9, 2001.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Calusine et al., "Analysis and mitigation of interface losses in trenched superconducting coplanar wave resonators", Applied Physics Letters, 112(6):062601, Feb. 1, 2018.
Cava, et al., "Electrical and magnetic properties of $Nb_2O_5$-crystallographic shear structures", Phys. Rev. B44, 6973—Published Oct. 1, 1991.
Clauss et al., "Broadband electron spin resonance from 500 MHz to 40 GHz using superconducting coplanar waveguides", Applied Physics Letters, Apr. 1, 2013.
Clauss et al., "Optimization of Coplanar Waveguide Resonators for ESR Studies on Metals", Journal of Physics: Conference Series, Mar. 1, 2015.
Daalmans, "HTS DC SQUIDs for practical applications", Science Direct, Jul. 1, 1995.
De Graaf et al., "Direct Identification of Dilute Surface Spins on $Al_2O_3$: Origin of Flux Noise in Quantum Circuits", Physical Review Letters, Jan. 1, 2017.
De Graaf et al., "Suppression of low-frequency charge noise in superconducting resonators by surface spin desorption", Nature Communications, 9(1):1143, Dec. 1, 2018.
Diniz et al., "Intrinsic photon loss at the interface of superconducting devices", arXiv, Mar. 10, 2020.
Doerner, S., et al., "Compact microwave kinetic inductance nanowire galvanometer for cryogenic detectors at 4.2 K," J. Phys. Commun., 2018, 8 pages.
Extended European Search Report for EP 18747996.5, dated Sep. 3, 2020, 8 pages.
Friedrich et al., "Onset of phase diffusion in high kinetic inductance granular aluminum micro-SQUIDs", arXiv, Aug. 29, 2019.
Gao et al., "Experimental evidence for a surface distribution of two-level systems in superconducting lithographed microwave resonators", Applied Physics Letters, 92(15):152505, Apr. 1, 2018.

Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Hinode et al., "Fabrication of reliable via conductors for niobium SFQ devices," Physica C 426-431:1533-1540, 2005.
Holzman et al., "On-chip integrable planar NbN nanoSQUID with broad temperature and magnetic-field operation range", AIP Advances, Oct. 23, 2019.
Hori et al., "Electron spin resonance study on pure single crystalline sapphire", P hys. Status Solidi C 10, No. 12, 1681-1683 (Nov. 5, 2013).
Hunt et al., "NbN/MgO/NbN edge-geometry tunnel junctions", Applied Physics Letters 55, 1982.
International Search Report for PCT/US2018/016237, mailed Jul. 2, 2018, 6 pages.
International Search Report for PCT/US2020/018137, mailed Jun. 3, 2020, 4 pages.
Japanese Office Action for Japanese Patent Application No. 2020-073654, mailed Aug. 17, 2021 (with English Translation) 5 pages.
Johnson et al., "Scalable Control System for a Superconducting Adiabatic Quantum Optimization Processor," Superconductor Science & Technology (2010).
Kwon et al., "Magnetic Field Dependent Microwave Losses in Superconducting Niobium Microstrip Resonators", Journal of Applied Physics, 124(3):033803, Jul. 1, 2018.
Lanting et al., "Evidence for temperature-dependent spin diffusion as a mechanism of intrinsic flux noise in SQUIDs", Physical Review B 89, 014503 (Jan. 7, 2014).
Lanting et al., "Geometrical dependence of the low-frequency noise in superconducting flux qubits", Physical Review B, 79, 060509, Jun. 5, 2009, 4 pages.
Levy-Bertrand et al., "Electrodynamics of granular aluminum from superconductor to insulator: observation of collective superconducting modes", arXiv, Mar. 13, 2019.
Lomatch et al., "Multilayer Josephson Flux Quantum Devices," IEEE Trans. Appi. Superconductivity, vol. 5, No. 2, Jun. 2, 1995.
Lucero, "Computing prime factors using a Josephson phase-qubit architecture: 15=3×5", A dissertation submitted in partial satisfaction of the requirements for the degree of Doctor of Philosophy in Physics, University of California Santa Barbara.
Il'ichev, et al. "Degenerate ground state in a mesoscopic $YBa_2Cu_3O_7$-x grain boundary Josephson junction", Physical Review Letters, vol. 86, No. 23, Jun. 4, 2001, 4 pages.
Annunziata , et al., "Tunable superconducting nanoinductors", IOP Science, Oct. 15, 2010, 11 pages.
Balashov , et al., "Superconductor-insulator-normal-conductor-insulator-superconductor process development for integrated circuit applications", IOP Science, Dec. 1, 1996, 11 pages.
Bruder , et al., "Tunnel junctions of Unconventional Superconductors", Physical Review, 1995, 5 pages.
Larsson , et al., "Transport properties of submicron $YBa_2Cu_3O_7$-d step-edge Josephson junctions", J. Appl. Phys. 90, 2001, 24 pages.
Lombardi , et al., "Tunnel barriers for an all-high-Tc single electron tunneling transistor", Physica C 368, 2002, 6 pages.
Martinis , et al., "UCSB final report for the CSQ program: Review of decoherence and materials physics for superconducting qubits", arXiv, Oct. 21, 2014, 10 pages.
Mazin , et al., "Thin film dielectric microstrip kinetic inductance detectors", arXiv, Feb. 1, 2010, 10 pages.
Ortlepp , et al., "RSFQ Circuitry Using Intrisic π-Phase Shifts", IEEE, Jun. 2007, 5 pages.
Schrieffer , et al., "Superconductivity", Rev. Mod. Phys., 71, 1999, 5 pages.
Sigrist , et al., "Unusual paramagnetic phenomena in granula high-temperature superconductors—A consequence of d-wave pairing?", Rev. Mod. Phys. 67, 1995, 5 pages.
Smilde , et al., "Y-Ba-Cu-O / Au / Nb Ramp-type Josephson Junctions", IEEE, 2001, 5 pages.
Tanaka , et al., "Theory of Josephson effects in anisotropic superconductor", Physical Review B 56, 1997, 21 pages.
Tolpygo , "Superconductor Digital Electronics: Scalability and Energy Efficiency Issues", arXiv, Feb. 10, 2016, 20 pages.

(56) References Cited

OTHER PUBLICATIONS

Tosi, et al., "Silicon quantum processor with robust long-distance qubit couplings", Nature, Sep. 6, 2017, 11 pages.
Anlage, et al., "A current controlled variable delay superconducting transmission line", IEEE, pp. 1388-1391.
Berkley, et al., "A scalable readout system for a superconducting adiabatic quantum optimization system", arXiv, May 6, 2009, 18 pages.
Dagan, et al., "Absence of Andreev reflections and Andreev bound states above the critical temperature". Phys. Rev. B 61, 2000, 5 pages.
Eom, et al., "A Wideband, Low-Noise Superconducting Amplifier with High Dynamic Range", arXiv, Jan. 11, 2012, 23 pages.
Kerber, et al., "An improved NbN integrated circuit process featuring thick NON ground plane and lower parasitic circuit inductances", IEEE, Jun. 1997, 6 pages.
Lisitskii, et al., "Annular Josephson junctions for radiation detection: fabrication and investigation of the magnetic behavior", Nuclear Instruments & Methods in Physics Research, Apr. 2000, 11 pages.
Macco, et al., "Atomic-layer deposited $Nb_2O_5$ as transparent passivating electron contact for c-Si solar cells", Science Direct, Sep. 2018, 7 pages.
Nicoletti, et al., "Bi-epitaxial YBCO grain boundary Josephson junctions on $SrTiO_3$ and sapphire substrates", Physica C 269, 1996, 13 pages.
Tolpygo, et al., "Advanced Fabrication Processes for Superconducting Very Large-Scale Integrated Circuits", IEEE, Jan. 19, 2016.
Yoon, et al., "Atomic-scale chemical analyses of niobium oxide/niobium interfaces via atom-probe tomography", AIP Applied Physics Letters, Oct. 2, 2008, 3 pages.
Blanquart et al., et al., "Evaluation and Comparison of Novel Precursors for Atomic Layer Deposition of $Nb_2O_5$ Thin Films", Chem. Mater., Feb. 8, 2012, 6 pages.
Born, et al., "Fabrication of Ultrasmall Tunnel Junctions by Electron Beam Direct-Writing", IEEE, 2001, 4 pages.
Buchholz, et al., "LTS junction technology for RSFQ and qubit circuit applications", Science Direct, Jul. 24, 2006, 8 pages.
Campbell, et al., "Dynamics of Oxidation of Aluminum Nanoclusters using Variable Charge Molecular-Dynamics Simulations on Parallel Computers", APS Physics, Jun. 14, 1999, 4 pages.
Chan, et al., "Interface between gold and superconducting $YBa_2Cu_3O_7$-x", J. Mater. Res, 1995, 6 pages.
Cucolo, et al., "Linear normal conductance in copper oxide tunnel junctions", Phys. Rev. B 54, 1996, 3 pages.
Dagan, et al., "C-axis tunneling on YBCO films", Eur. Phys. J. B 19, 2001, 5 pages.
Dimos, et al., "Orientation Dependence of Grain-Boundary Critical Currents in $YBa_2Cu_3O_7$ Biocrystals", Physical Review Letters, Jul. 11, 1988, 5 pages.
Dolata, et al., "Platinum thin film resistors with Cr under- and overlayers for $Nb/Al_2O_3/Nb$ technology", Science Direct, Jul. 19, 2005, 4 pages.
Faucher, et al., "Niobium and niobium nitride SQUIDs based on anodized nanobridges made with an atomic force microscope", Science Direct, Mar. 1, 2002, 7 pages.
Geerlings, et al., "Improving the Quality Factor of Microwave Compact Resonators by Optimizing their Geometrical Parameters", Applied Physics Letters, 2012, 4 pages.
Grabert, et al., "Mesoscopic Josephson effect", Superlattices and Microstructures 25, 2019, 10 pages.
Grünhaupt, et al., "Granular aluminum: A superconducting material for high impedance quantum circuits", arXiv, Sep. 27, 2018, 9 pages.
Grünhaupt, et al., "Quasiparticle dynamics in granular aluminum close to the superconductor to insulator transition", arXiv, Feb. 7, 2018.
Hadfield, et al., "Novel Josephson junction geometries in NbCu bilayers fabricated by focused ion beam microscope", Physica C, North-Holland Publishing, Amsterdam, Feb. 15, 2002, 9 pages.
Harris, "Improved coherence leads to gains in quantum annealing performance", D-Wave, 2019, 4 pages.
Havemann, et al., "High-performance interconnects: an integration overview", IEEE, May 2001, 16 pages.
Herr, et al., "Reproducible Operating Margins on a 72,800-Device Digital Superconducting Chip", arXiv, Oct. 5, 2015, 6 pages.
Hilgenkamp, et al., "Implications of $dx^2-y^2$ symmetry and faceting for the transport properties of grain boundaries in high-TC superconductors", Physical Review B 53, 1996, 8 pages.
Hinode, et al., "Fabrication of reliable via conductors for niobium SFQ devices", Science Direct, Jul. 19, 2005, 8 pages.
Hypres, "Niobium Integrated Circuit Fabrication Process #S45/100/200 Design Rules", Hypres, Mar. 10, 2015, 9 pages.
Iguchi, et al., "Experimental evidence for a d-wave pairing state in $YBa_2Cu_3O_7$-y from a study of $YBa_2Cu_3O_7$-y/insulator/Pb Josephson tunnel junctions", Phys. Rev. B 49, 1994, 4 pages.
Il'ichev, et al., "Nonsinusoidal Current-Phase Relationship of Grain Boundary Josephson junctions in High-Tc Superconductors", Physical Review Letters 81, 1998, 4 pages.
Joyez, et al., "Observation of Parity-Induced Suppression of Josephson Tunneling in the Superconducting Single Electron Transistor", Phys. Rev., Lett. 72, Jul. 19, 2005, 5 pages.
Koelle, et al., "High-transition-temperature superconducting quantum interference devices", Reviews of Modern Physics 71, 199, 56 pages.
Kohl, "Low-Dielectric Constant Insulators for Future Integrated Circuits and Packages", Georgia Tech, Mar. 14, 2011, 25 pages.
Kouznetsov, et al., "c-axis Josephson Tunneling between $YBa_2Cu_3O_7$-δ and Pb: Direct Evidence for Mixed Order Parameter Symmetry in a High-Tc Superconductor", Phys. Rev. Lett. 79, 1997, 4 pages.
Kubatkin, et al., "Coulomb blockade electrometer with a high-Tcisland", JETP Letters 63, 1996, 7 pages.
Levinsen, "Electromagnetic properties of the Dayem bridge", HAL Archives, Jan. 1, 1974, 11 pages.
Maleeva, et al., "Circuit Quantum Electrodynamics of Granular Aluminum Resonators", arXiv, Feb. 7, 2018, 17 pages.
Martinis, et al., "Critical Field for Complete Vortex Expulsion from Narrow Superconducting Strips", UCSB, Mar. 5, 2004, 4 pages.
Matveev, et al., "Parity-Induced Suppression of the Coulomb Blockade of Josephson Tunneling", Phys. Rev. Lett. 70, 1993, 4 pages.
McKenney, et al., "Design considerations for a background limited 350 micron pixel array using lumped element superconducting microresonators", SPIE, Sep. 24, 2012, 10 pages.
Nagasawa, et al., "Development of advanced Nb process for SFQ circuits", Science Direct, Jun. 9, 2004, 8 pages.
Potts, et al., "CMOS compatible fabrication methods for submicron Josephson junction qubits" IEEE, Sep. 5, 2001, 4 pages.
Russo, et al., "Characterization of Superconducting Thin Films and nanoSQUIDs for Nanoparticle Investigation at High Magnetic Field", IEEE, Feb. 18, 2012, 4 pages.
Satoh, et al., "Fabrication process of planarized multi-layer Nb integrated circuits", IEEE, Jun. 13, 2005, 4 pages.
Satoh, et al., "Planarization of Josephson junctions for large-scale integrated Nb SFQ circuits by mechanical polishing", Science Direct, 1999, 4 pages.
Tafuri, et al., "Feasibility of Biepitaxial YbaCuO Josephson Junctions for Fundamental Studies and Potential Circuit Implementation", Los Alamos National Laboratory preprint server condmat, Dec. 18, 2002, 21 pages.
Tolpygo, et al., "Deep Sub-Micron Stud-Via Technology for Superconductor VLSI Circuits", IOP Science, Jan. 14, 2014, 10 pages.
Tsuei, et al., "Pairing symmetry in cuprate superconductors", Reviews of Modern Physics 72, 2000, 48 pages.
Valenti, et al., "Interplay between kinetic inductance, non-linearity and quasiparticle dynamics in granular aluminum MKIDs", arXiv, Nov. 10, 2018, 14 pages.
Van Harlingen, "Phase-sensitive tests of the symmetry of the pairing state in the high-temperature superconductors—Evidence for $dx^2-y^2$ symmetry", Rev. Mod. Phys. 67, 1995, 23 pages.
Vinante, et al., "Hot-electron effect in palladium thin films", APS Physics, Mar. 13, 2007, 5 pages.

(56) References Cited

OTHER PUBLICATIONS

Wen, et al., "Microstructure of ramp-edge Yba2Cu3O3/PrBa2Cu3O2 Josephson junctions on different substrates", Physica C 255, 1995, 13 pages.

Wollman, et al., "Evidence for dx2-y2 Pairing from the Magnetic Field Modulation of YBa2Cu3O7-Pb Josephson Junctions", Phys. Rev. Lett 74, Jan. 30, 1995, 4 pages.

Yohannan, "Characterization of alpha and beta phases of tantalum coatings", New Jersey Institute of Technology, Aug. 31, 2001, 107 pages.

Zantye, Parshuram B, et al., "Chemical mechanical planarization for microelectronics application", Materials Science and Engineering R 45 (2004) 89-220, 2004 (Year: 2004), 132 pages.

KINETIC INDUCTANCE DEVICES, METHODS FOR FABRICATING KINETIC INDUCTANCE DEVICES, AND ARTICLES EMPLOYING THE SAME

FIELD

This disclosure generally relates to superconducting integrated circuits, methods for fabrication of superconducting integrated circuits, and devices for use in superconducting integrated circuits, and in particular, relates to kinetic inductance devices and the fabrication of kinetic inductance devices and/or integrated circuits including kinetic inductance devices, for example quantum processors, for instance superconducting quantum processors.

BACKGROUND

Quantum Devices

Quantum devices are structures in which quantum mechanical effects are observable. Quantum devices include circuits in which current transport is dominated by quantum mechanical effects. Such devices include spintronics and superconducting circuits. Both spin and superconductivity are quantum mechanical phenomena. Quantum devices can be used for measurement instruments, in computing machinery, and the like.

Quantum Computation

A quantum computer is a system that makes direct use of at least one quantum-mechanical phenomenon, such as superposition, tunneling, and entanglement, to perform operations on data. The elements of a quantum computer are qubits. Quantum computers can provide speedup for certain classes of computational problems such as computational problems simulating quantum physics.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

Superconducting qubits are solid state qubits based on circuits of superconducting materials. Operation of superconducting qubits is based on the underlying principles of magnetic flux quantization, and Josephson tunneling. Superconducting effects can be present in different configurations and can give rise to different types of superconducting qubits including flux, phase, charge, and hybrid qubits. The different configurations can vary in the topology of the loops, the placement of the Josephson junctions, and the physical parameters of elements of the superconducting circuits, such as inductance, capacitance, and Josephson junction critical current.

In one implementation, the superconducting qubit includes a superconducting loop interrupted by a Josephson junction. The ratio of the inductance of the Josephson junction to the geometric inductance of the superconducting loop can be expressed as $2\pi L I_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

The foregoing examples of the related art and limitations related thereto are intended to be illustrative and not exclusive, nor as any admission that such constitute prior art. Other limitations of the related art will become apparent to those of skill in the art upon a reading of the specification and a study of the drawings.

BRIEF SUMMARY

According to an aspect, there is provided a superconducting integrated circuit comprising a substrate and a first layer of high kinetic inductance material directly or indirectly overlying at least a portion of the substrate, the first layer of high kinetic inductance material comprising a superconducting device, the superconducting device comprising a compound Josephson junction, the compound Josephson junction comprising two parallel paths, each parallel path interrupted by a respective Josephson junction, each Josephson junction comprising a restriction in the first layer of high kinetic inductance material and an inductance electrically in parallel with the compound Josephson junction.

According to other aspects, at least 10% of the energy stored in the first layer of high kinetic inductance material may be stored as kinetic inductance, a kinetic inductance fraction of the first layer of high kinetic inductance material may be $0.1 < \alpha \le 1$, the first layer of high kinetic inductance material may comprise one of WSi, MoN, NbN, NbTiN, TiN, and granular Aluminum, a surface of the first layer of high kinetic inductance material may be planar, the inductance may comprise an energy storage element and a coupler, the coupler may comprise a portion of the energy storage element, the superconducting integrated circuit may further comprise a controllable device coupled to the coupler of the control device, the controllable device may comprise a qubit, the superconducting integrated circuit may further comprise a second layer of high kinetic inductance material, and the second layer of high kinetic inductance material may comprise the qubit, the second layer may be in a separate plane from a plane in which the first layer resides, the second layer of high kinetic inductance material may have a thickness that is less than the thickness of the first layer of high kinetic inductance material, the superconducting integrated circuit may further comprise a plurality of programmable devices comprising superconducting qubits and one or more couplers, wherein the controllable device comprises a target device of the plurality of programmable devices, a power line that extends bi-directionally from the compound Josephson junction, and/or one or more control lines coupled to the compound Josephson junction, and the one or more control lines may comprise two control lines, and the two control lines and the power line may be addressable by a triplet of three signals a successive number of times to store a variable number of flux quanta.

According to an aspect, there is provided a superconducting integrated circuit comprising a first kinetic inductance layer comprising high kinetic inductance material, the first kinetic inductance layer comprising a kinetic inductance device, the kinetic inductance device comprising a body portion comprising a length and a width, a Josephson junction interrupting the body portion spaced along the length of the body portion, the Josephson junction comprising a restriction having a width that is less than the width of the body portion, a first coupler, and an additional device comprising a second coupler that couples the additional device to the first coupler of the kinetic inductance device.

According to other aspects, the body portion may comprise a compound Josephson junction structure comprising two parallel current paths interrupted by respective Josephson junctions, each Josephson junction comprising a restriction in the high kinetic inductance material of the first kinetic inductance layer, the kinetic inductance device may further comprise an energy storage element that extends from the compound Josephson junction structure, the kinetic inductance device may comprise one of a qubit, an inductance tuner, a coupler, a superconducting quantum interference device (SQUID) switch, and a digital to analog converter, at least 10% of the energy stored in the high kinetic inductance material may be stored as kinetic inductance, a kinetic inductance fraction of the high kinetic inductance material may be $0.1<\alpha \leq 1$, the high kinetic inductance material may comprise one of WSi, MoN, NbN, NbTiN, TiN, and granular Aluminum, the first kinetic inductance layer may be substantially planar, the additional device may comprise a qubit, the superconducting integrated circuit may comprise one or more additional layers that are distinct from the first kinetic inductance layer, and the one or more additional layers may comprise the additional device, the one or more additional layers may be in one or more separate planes from a plane in which the first kinetic inductance layer resides, and the one or more additional layers may comprise a second layer of high kinetic inductance material having a thickness that is less than the thickness of the first kinetic inductance layer.

According to an aspect, there is provided a method of forming a superconducting integrated circuit comprising forming a kinetic inductance device in a first kinetic inductance layer, the first kinetic inductance layer comprising a high kinetic inductance material, the kinetic inductance device comprising a body portion comprising a length and a width, a Josephson junction interrupting the body portion spaced along the length of the body portion, the Josephson junction comprising a restriction having a width that is less than the width of the body portion, and a first coupling structure and forming a second device such that the second device is coupled to the first coupling structure.

According to other aspects, forming a kinetic inductance device may include depositing the first kinetic inductance layer to directly or indirectly overlie at least a portion of a substrate and then patterning the first kinetic inductance layer, forming a kinetic inductance device may include depositing a resist layer to overlie a substrate, patterning the resist layer, depositing the first kinetic inductance layer after patterning the resist layer, and removing at least a portion of the resist layer after depositing the first kinetic inductance layer, forming the kinetic inductance device may comprise forming the kinetic inductance device having a compound Josephson junction structure comprising two parallel current paths interrupted by respective Josephson junctions, each Josephson junction comprising a restriction in the high kinetic inductance material of the first kinetic inductance layer, forming the kinetic inductance device may further comprise forming an energy storage element extending from the compound Josephson junction structure, forming the kinetic inductance device may comprise forming one of a qubit, an inductance tuner, a coupler, a superconducting quantum interference device (SQUID) switch, and a digital to analog converter, forming the second device may comprise forming a qubit, forming the second device may comprise depositing one or more second layers directly or indirectly overlying at least a portion of a substrate, at least one of the one or more second layers comprising a superconducting material and patterning the one or more second layers to form the second device, depositing one or more second layers may comprises depositing a second layer of high kinetic inductance material having a thickness that is less than the thickness of the first kinetic inductance layer, forming the kinetic inductance device may comprise forming the kinetic inductance device directly or indirectly overlying at least a portion of a substrate, forming a first kinetic inductance layer directly or indirectly overlying at least a portion of the substrate may comprise depositing the first kinetic inductance layer directly on the substrate, and forming a second device may comprise forming the second device directly on the substrate, forming a second device may comprise forming the second device directly or indirectly overlying at least a portion of the first kinetic inductance layer, and forming a kinetic inductance device in a first kinetic inductance layer comprises forming the kinetic inductance device directly or indirectly overlying at least a portion of the second device.

In other aspects, the features described above may be combined together in any reasonable combination as will be recognized by those skilled in the art.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure, or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Exemplary Computing System

Figure 1:
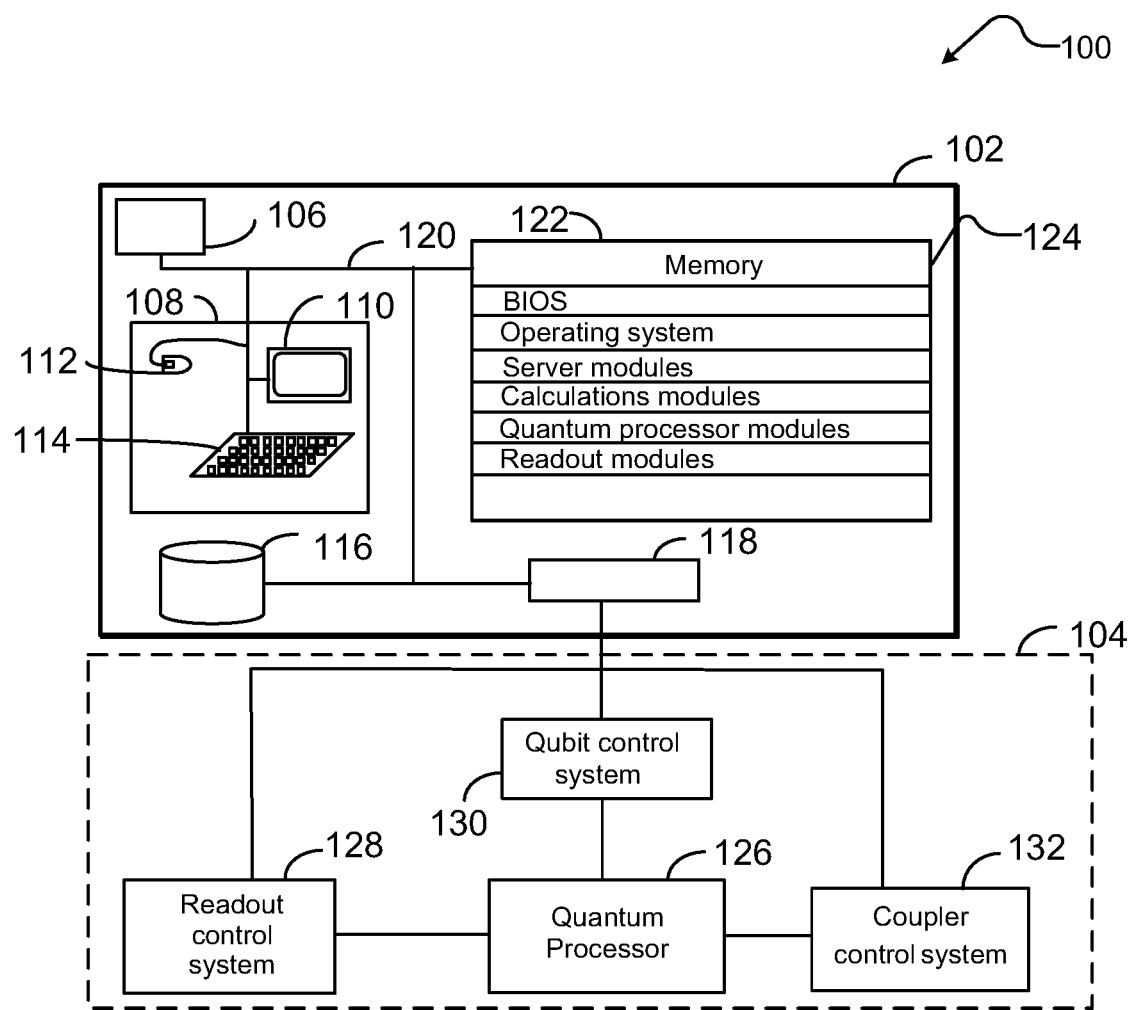
FIG. 1 is a schematic diagram of a hybrid computing system including a digital computer coupled to an analog computer, in accordance with the present systems, devices, and methods.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store one or more sets of processor-executable instructions, which may be referred to as modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit fabricated using systems and methods including those described in the present application. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random-access memory ("SRAM"), Flash NAND; and volatile memory such as random-access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules or modules 124) for digital computer 102.

Although digital computer 102 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory. Or a solid-state disk that employs integrated circuits to provide non-volatile memory.

Various processor- or computer-readable and/or executable instructions, data structures, or other data may be stored in system memory 122. For example, system memory 122 may store instructions for communicating with remote clients and scheduling use of resources including resources on the digital computer 102 and analog computer 104. Also, for example, system memory 122 may store at least one of processor executable instructions or data that, when executed by at least one processor, causes the at least one processor to execute the various algorithms to execute instructions. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104.

Analog computer 104 may include at least one analog processor such as quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices. Qubits may be read out via readout system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines. Qubit control system 130 and coupler control system 132 may be used to implement a quantum annealing schedule on analog processor 104. Programmable elements may be included in quantum processor 126 in the form of an integrated circuit. Qubits and couplers may be positioned in layers of the integrated circuit that comprise a first material. Other devices, such as readout control system 128, may be positioned in other layers of the integrated circuit that comprise a second material.

Exemplary Superconducting Quantum Processor

Figure 2:
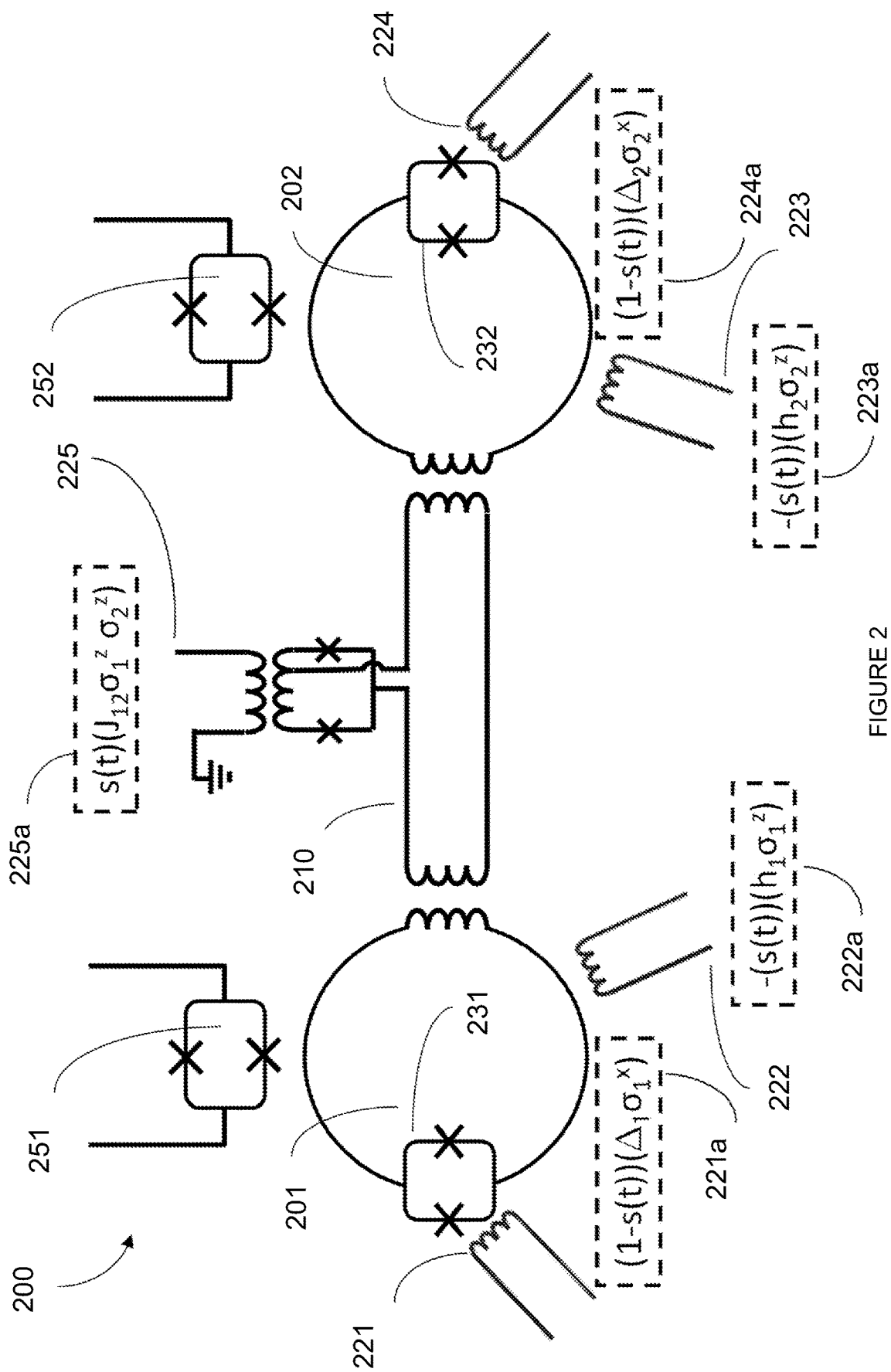
FIG. 2 is a schematic diagram of a portion of an exemplary superconducting quantum processor.

FIG. 2 is a schematic diagram of a portion of an exemplary superconducting quantum processor 200, according to at least one implementation. The portion of superconducting quantum processor 200 shown in FIG. 2 includes two superconducting qubits 201, and 202. Also shown is a tunable coupling (diagonal coupling) via coupler 210 between qubits 201 and 202 (i.e., providing 2-local interaction). While the portion of quantum processor 200 shown in FIG. 2 includes only two qubits 201, 202 and one coupler 210, those of skill in the art will appreciate that quantum processor 200 may include any number of qubits and any number of couplers coupling information between them.

Quantum processor 200 includes a plurality of interfaces 221-225 that are used to configure and control the state of quantum processor 200. Each of interfaces 221-225 may be realized by a respective inductive coupling structure, as illustrated, as part of a programming subsystem and/or an evolution subsystem. Alternatively, or in addition, interfaces 221-225 may be realized by a galvanic coupling structure. In some implementations, one or more of interfaces 221-225 may be driven by one or more DACs. Such a programming subsystem and/or evolution subsystem may be separate from quantum processor 200, or it may be included locally (i.e., on-chip with quantum processor 200).

In the operation of quantum processor 200, interfaces 221 and 224 may each be used to couple a flux signal into a respective compound Josephson junction 231 and 232 of qubits 201 and 202, thereby realizing a tunable tunneling term (the $\Delta_i$ term) in the system Hamiltonian. This coupling provides the off-diagonal $\sigma^x$ terms of the Hamiltonian and these flux signals are examples of "delocalization signals". Examples of Hamiltonians (and their terms) used in quantum computing are described in greater detail in, for example, US Patent Application Publication No. 20140344322.

Similarly, interfaces 222 and 223 may each be used to apply a flux signal into a respective qubit loop of qubits 201 and 202, thereby realizing the $h_i$ terms (dimensionless local fields for the qubits) in the system Hamiltonian. This coupling provides the diagonal $\sigma^z$ terms in the system Hamiltonian. Furthermore, interface 225 may be used to couple a flux signal into coupler 210, thereby realizing the $J_{ij}$ term(s) (dimensionless local fields for the couplers) in the system Hamiltonian. This coupling provides the diagonal $\sigma_i^z \sigma_j^z$ terms in the system Hamiltonian.

In FIG. 2, the contribution of each of interfaces 221-225 to the system Hamiltonian is indicated in boxes 221a-225a, respectively. As shown, in the example of FIG. 2, the boxes 221a-225a are elements of time-varying Hamiltonians for quantum annealing and/or adiabatic quantum computing.

Throughout this specification and the appended claims, the term "quantum processor" is used to generally describe a collection of physical qubits (e.g., qubits 201 and 202) and couplers (e.g., coupler 210). The physical qubits 201 and 202 and the coupler 210 are referred to as the "programmable devices" of the quantum processor 200 and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 222, 223, and 225) used to apply the programmable parameters to the programmable devices of the quantum processor 200 and other associated control circuitry and/or instructions.

As previously described, the programming interfaces of the programming subsystem may communicate with other subsystems which may be separate from the quantum processor or may be included locally on the processor. The programming subsystem may be configured to receive programming instructions in a machine language of the quantum processor and execute the programming instructions to program the programmable devices in accordance with the programming instructions. Similarly, in the context of a quantum processor, the term "evolution subsystem" generally includes the interfaces (e.g., "evolution interfaces" 221 and 2024) used to evolve the programmable devices of the quantum processor 200 and other associated control circuitry and/or instructions. For example, the evolution subsystem may include annealing signal lines and their corresponding interfaces (221, 224) to the qubits (201, 202).

Quantum processor 200 also includes readout devices 251 and 252, where readout device 251 is associated with qubit 201 and readout device 252 is associated with qubit 202. In the example implementation shown in FIG. 2, each of readout devices 251 and 252 includes a DC-SQUID (direct current superconducting quantum interference device) inductively coupled to the corresponding qubit. In the context of quantum processor 200, the term "readout subsystem" is used to generally describe the readout devices 251, 252 used to read out the final states of the qubits (e.g., qubits 201 and 202) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.), any of which may comprise DACs. Qubit readout may also be performed using alternative circuits, such as that described in International (PCT) Patent Application Publication WO2012064974.

While FIG. 2 illustrates only two physical qubits 201, 202, one coupler 210, and two readout devices 251, 252, a quantum processor (e.g., processor 200) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art.

Examples of superconducting qubits include superconducting flux qubits, superconducting charge qubits, and the like. In a superconducting flux qubit, the Josephson energy dominates or is equal to the charging energy. In a charge qubit it is the reverse. Examples of flux qubits that may be used include rf-SQUIDs (radio frequency superconducting quantum interference devices), which include a superconducting loop interrupted by one Josephson junction, persistent current qubits, which include a superconducting loop interrupted by three Josephson junctions, and the like.

Digital to Analog Converters (DACs)

As discussed above with respect to the exemplary quantum processor 200, quantum processors provide a plurality of programmable devices for performing computations with quantum effects. Programmable devices include qubits, couplers (which programmably couple qubits), and components thereof. Programmable devices are programmed via signals applied to influence their operation—for example, a biasing signal may be applied to a flux qubit to affect its flux during computation.

Such signals often require conversion and/or storage prior to being applied to programmable devices. For example, a classical computer may generate digital signals for the quantum processor, and those digital signals may be converted to analog form via one or more digital-to-analog converter (DAC). The converted analog signal may then be applied to the programmable device. As another example, a signal (which may be digital or analog) may be received by the quantum processor at one time before or during a computation and stored via a DAC until the signal is to be applied to a programmable device at a later time. DACs may be used for one or more of these purposes (i.e., conversion and/or memory) and/or for other purposes including storage, programming, and readout within a quantum processor. Examples of applications of DACs for these and other purposes are described in greater detail in, for example, U.S. Pat. Nos. 7,876,248 and 8,098,179. The operation of Josephson junctions and/or CJJs in DACs is described in greater detail in, for example, U.S. Pat. Nos. 7,876,248 and 8,098, 179, U.S. Patent Application Publication No. 2018/0101786, and U.S. patent application Ser. No. 16/098,801.

Although the term DAC is used throughout, it will be understood that the described devices may be used for a variety of purposes which are not necessarily restricted to converting digital signals to analog signals (and, in some implementations, do not involve such conversion at all). For example, as described above, superconducting DACs may be used by quantum processors to store a signal for a period of time (e.g., thereby operating as a form of memory).

Kinetic Inductance

Current flowing through a metal material in principle stores energy both in the magnetic field of that metal and in the kinetic energy of the charge carriers (e.g., the electrons or Cooper pairs). In non-superconducting metals, the charge carriers collide frequently with the lattice and lose their kinetic energy as Joule heating. This is also referred to as scattering, and quickly releases energy. However, in superconducting materials, scattering is substantially reduced, as the charge carriers are Cooper pairs which are protected against dissipation through scattering. This allows for superconducting materials to store energy in the form of kinetic inductance. This phenomenon allows kinetic inductance to efficiently store energy within the superconducting metal. Kinetic inductance is at least in part determined by the inertial mass of the charge carriers of a given material and increases as carrier density decreases. As the carrier density decreases, a smaller number of carriers must have a proportionally greater velocity in order to produce the same current. Materials that have high kinetic inductance for a given area (as defined below) are referred to as "kinetic inductance materials", or "high kinetic inductance materials".

Kinetic inductance materials are those that have a high normal-state resistivity and/or a small superconducting energy gap, resulting in a larger kinetic inductance per unit of area. In general, total inductance L of a superconducting material is given by $L=L_K+L_G$, where $L_G$ is the geometric inductance and $L_K$ is the kinetic inductance. The kinetic inductance of a superconducting film in near-zero temperatures is proportional to the effective penetration depth $\lambda_{eff}$. In particular, for a film with a given thickness t, the kinetic inductance of the film is proportional to the ratio of the length of the film L to the width of the film W, where length is in the direction of the current and width is orthogonal to length (note that both width and length are orthogonal to the dimension in which thickness is measured). That is, $$L_K \sim \lambda_{eff} \frac{L}{W}$$

for a superconducting film with a given thickness. The kinetic inductance fraction of a material is characterized as $$\alpha = \frac{L_k}{L_g + L_k}.$$

A material considered to have high kinetic inductance would typically have $\alpha$ in the range of $0.1 < \alpha \leq 1$. Materials with less than 10% of the energy stored as kinetic inductance would be considered traditional magnetic storage inductors with a small correction.

In some implementations it may be beneficial to attempt to maximize kinetic inductance in minimal volume. This may include attempting to minimize the width of the film, selecting a suitable material with a high effective penetration depth $\lambda_{eff}$, and selecting a length for the film which achieves the desired kinetic inductance. It may also be beneficial to attempt to minimize the thickness t of the material, subject to fabrication constraints, as for $t < 3\lambda_{eff(bulk)}$ (where $\lambda_{eff(bulk)}$ is the effective penetration depth of the material in bulk, not thin-film), $\lambda_{eff}$ increases at least approximately proportionately to $1/t^2$. In some implementations, $t < n \lambda_{eff(bulk)}$, where n is some value substantially less than 1 (e.g., 0.5, 0.1, 0.05, 0.01, etc.).

Josephson Junctions in KI Material

Josephson junctions serve as a fundamental source of nonlinearity and tunneling for quantum devices. In the context of superconducting materials, when two or more superconductors are coupled by a weak link the structure forms a Josephson Junction. In some devices, Josephson junctions include a trilayer structure made up of a first layer of superconducting material, a thin insulating barrier, and a second layer of superconducting material. See, for example, U.S. Pat. No. 8,951,808 and U.S. patent application Ser. No. 16/481,788.

Fabricating trilayer Josephson junctions generally involves at least two metal evaporations and a precisely timed oxidation operation. While trilayer structures may have some beneficial characteristics, providing a trilayer structure within an integrated circuit may result in fabrication difficulties. An alternative form of Josephson junction is referred to as a Dayem bridge and is a thin-film type of Josephson junction where the weak link is a physical restriction such as a narrowing that weakens the superconductivity at that point, rather than an insulating barrier. See, for example, Friedrich et al., *Onset of phase diffusion in high kinetic inductance granular aluminum micro-SQUIDs*, arXiv:1908.11067v1. Single layer high kinetic inductance Josephson junctions may beneficially exhibit many of the same properties as trilayer structures while offering advantages in terms of ease of fabrication and design flexibility.

Kinetic Inductance DAC

Figure 3:
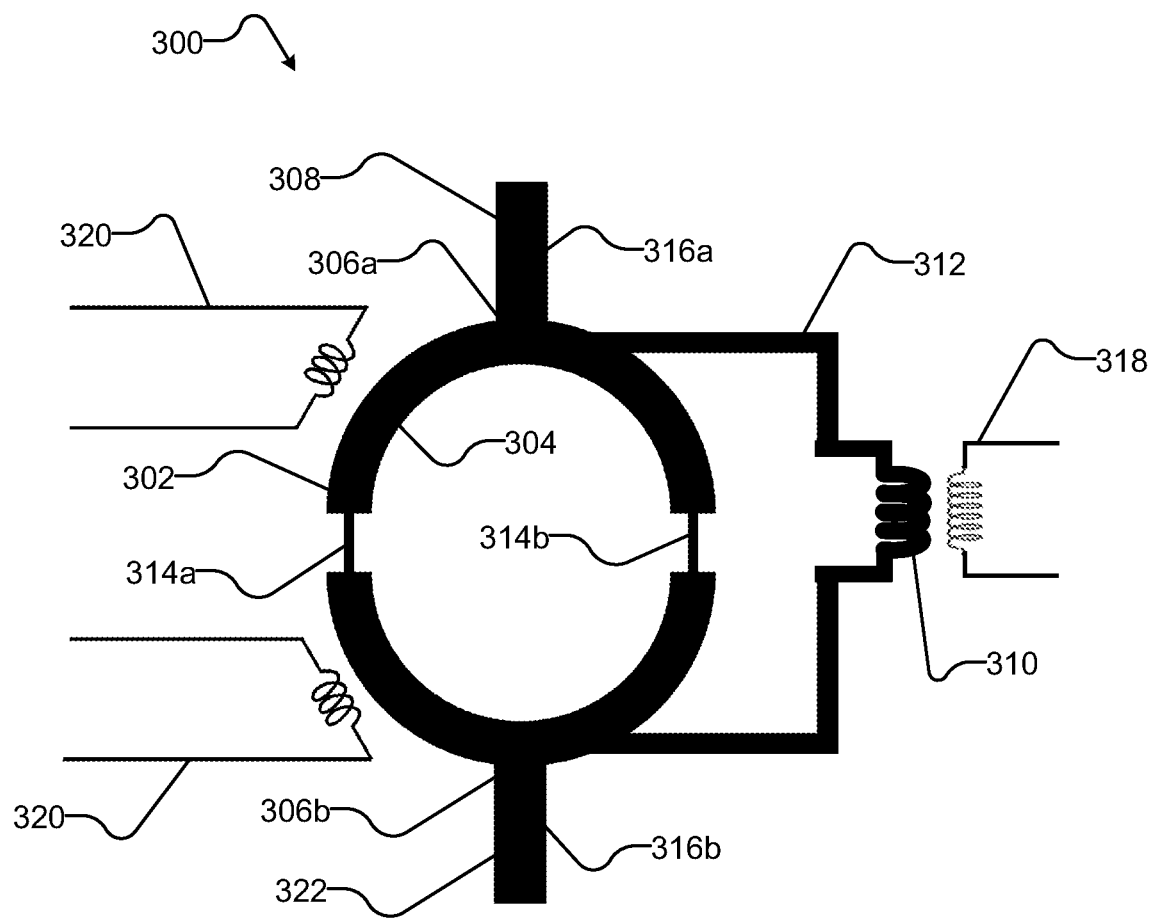
FIG. 3 is a schematic diagram of an exemplary Digital to Analog Converter (DAC).

FIG. 3 shows a superconducting integrated circuit 300 having control device 302 in the form of a DAC as discussed above, formed from one layer of high kinetic inductance material. The high kinetic inductance material is a superconducting material that experiences a transition to superconducting behavior at a critical temperature $T_C$. Above $T_C$, the material is non-superconducting, while below $T_C$ the material behaves as a superconductor. The critical temperature is also referred to in the present application as the transition temperature. As discussed above, a high kinetic inductance material may be defined as one where at least 10% of the energy stored in the high kinetic inductance material is stored as kinetic inductance, or where the kinetic inductance fraction of the high kinetic inductance material is $0.1 < \alpha \leq 1$. In some implementations, the layer of high kinetic inductance material may be one of WSi, MoN, NbN, NbTiN, TiN, and granular Aluminum, and may be substantially planar. The dimensions of the devices may be varied according to the application and the fabrication parameters. For example, in some implementations high kinetic inductance material may be deposited by electron beam lithography or vacuum evaporation and may have a thickness of 20-50 nm and a line width of 130 nm. Material may also be deposited by a sputtering process, or by other deposition processes. Etch or liftoff processes may be used to pattern the layer. In some implementations, for example, where lithography is used, the dimensions may be selected from as small as a few nanometers to larger than a few microns. In addition, the thickness of the layer may be varied between as small as a few nanometers to thicker than a few hundred nanometers.

Control device 302 is formed directly or indirectly overlying a substrate. As used herein, directly overlying a substrate refers to the layer being formed directly on the substrate without an intervening layer. Indirectly overlying a substrate refers to the layer being formed over at least a portion of the substrate, with at least one intervening layer between the substrate and the referenced layer. Control device 302 may be placed either directly on the substrate or may have intervening layers between superconducting integrated circuit 300 and the substrate, as shown in FIGS. 4A through 4E. Control device 302 has a loop of material 304, electrical connections 306a and 306b (collectively 306) between loop of material 304 and a power line 308. A pair of Josephson junctions 314a, 314b (collectively 314) interrupt loop of material 304, forming a compound Josephson junction. Each Josephson junction is formed from a restriction in the layer of high kinetic inductance material that provides non-linearity to the circuit, and may form a Dayem bridge, as discussed above. The restriction may, for example, be a narrowing of the layer of high kinetic inductance material, or a thinner portion or other barrier to linear transmission. A narrowed or thinner portion may be referred to as a neck or necked portion. It will be understood that additional Josephson junctions may also be included in some implementations to form compound-compound Josephson junctions (CCJJs) within control device 302. As used herein, compound-compound Josephson junction refers to a Josephson Junction where one or more of the junctions within a compound Josephson junction is itself a compound Josephson junction. See, for example, International (PCT) Patent Application Publication Number WO2010/028183 for a detailed description of a qubit with a CCJJ.

Josephson junctions 314 are electrically coupled between electrical connections 306 and in parallel with one another in loop of material 304. Power line 308 has an inflow portion 316a and an outflow portion 316b, and outflow portion 316b may optionally provide a current to other devices (e.g., by acting as an inflow portion 316a for other devices). Power line 308 supplies a current that flows through superconducting loop 304. In some implementations, DACs are serially coupled together by inflow and outflow portions 316a, 316b, thereby providing current to a plurality of DACs.

Control device 302 further has a coupling element 310 connected to loop of material 304, and an energy storage element 312 connected to loop of material 304. Energy storage element 312 and coupling element 310 may form an inductance electrically in parallel with the compound Josephson junction formed by Josephson junctions 314. In some implementations, as shown in FIG. 3, coupling element 310 may be connected to loop of material 304 via energy storage element 312. Coupling element 310 and energy storage element 312 receive a superconducting current mediated by the state of Josephson junctions 314. In some implementations, energy storage element 312 and coupling element 310 are combined into one element. For example, if energy storage element 312 also provides sufficient flux, all or part of it may be used as all or part an inductive coupling element.

In some implementations, a controllable device 318 may be coupled to coupling element 310 of control device 302. Coupling element 310 may be an inductor providing an inductive connection between control device 302 and controllable device 318. For example, controllable device 318 may be a qubit, and coupling element 310 may inductively couple to provide control of the qubit. In the implementation shown in FIG. 4C, a qubit may be formed in a separate layer with a trilayer Josephson junction. In the implementation shown in FIG. 4D, qubit 412d may be formed by a second layer of high kinetic inductance material having a thickness that is less than the thickness of the first layer of high kinetic inductance material. It will be understood that in other implementations the second layer of high kinetic inductance material may have a thickness that is greater than or the same as the thickness of the first layer of high kinetic inductance material. Circuit 300 may also include a plurality of programmable devices including superconducting qubits and one or more couplers for communicatively coupling the superconducting qubits. Control device 302 may control a target device of the plurality of programmable devices, for example, a qubit as described previously, a coupler, or another device.

In order to program and use control device 302, superconducting integrated circuit 300 may include one or more control lines 320 coupled to loop of material 304. In some implementations, two control lines may be provided, and the two control lines and the power line may be addressable by a triplet of three signals a successive number of times to store a variable number of flux quanta. For example, superconducting integrated circuit 300 may, for example, include two control lines 320a and 320b of FIG. 3 (collectively referred to as control lines 320). It will be understood that the positioning of control lines 320 in FIG. 3 is representative only. In some implementations, the transformers for control lines 320a and 320b may be placed equally spaced on either side of the power line. This may beneficially avoid cross-talk in storage element 312. Two addressing lines and a power line may be used in an X-Y-Z addressing scheme to address DACs, with each line providing a portion of flux quanta ($\Phi_0$) such that the insertion of single flux quanta into the DAC storage can be controlled. A description of X-Y-Z addressing can be found in Bunyk et al., Architectural considerations in the design of a superconducting quantum annealing processor (https://arxiv.org/pdf/1401.5504.pdf). Other addressing schemes to control the DACs may also be used, including using a shift register and a QFP DAC in combination, addressing through frequency multiplexing and providing high frequency current in one or more superconducting resonators, as described in International (PCT) Publication No. WO 2019/222514, or through pulse generation as described in U.S. Patent Application Publication No. 62/850,309. Other addressing techniques may be used as will be understood by those of skill in the art.

Figure 4A:
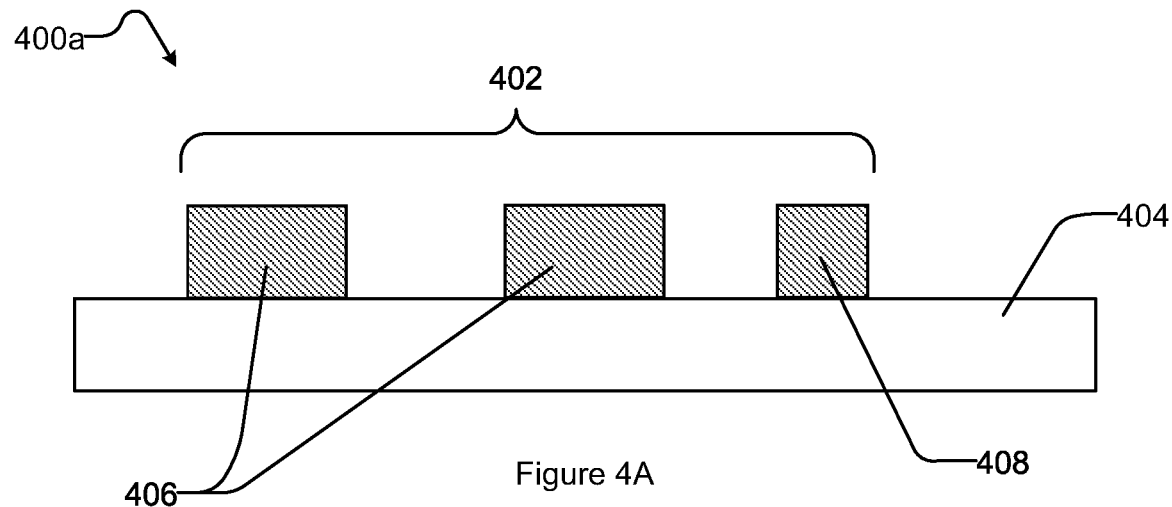
FIG. 4A is a sectional view of a portion of a superconducting integrated circuit including a one kinetic inductance layer DAC.

Referring to FIG. 4A, an implementation of a superconducting integrated circuit 400a is shown. FIG. 4A may be a cross-section of a device such as device 302 shown in FIG. 3, and the structure of integrated circuit 400a can be interpreted with reference to FIG. 3. Superconducting integrated circuit 400a includes a substrate 404 and a first layer of high kinetic inductance material directly or indirectly overlying substrate 404. The first layer of high kinetic inductance material is patterned (e.g., masked and etched) to form superconducting device 402. Superconducting device 402 has a compound Josephson junction 406 with two parallel paths. Each parallel path is interrupted by a respective Josephson junction, as shown in FIG. 3. As discussed above, each Josephson junction is formed as a restriction in the first layer of high kinetic inductance material, such as a narrowing of the material. Superconducting device 402 also has an inductance 408 electrically in parallel with compound Josephson junction 406. As discussed above with respect to FIG. 3, a power line may extend bi-directionally from compound Josephson junction 406 and may be formed in the first layer of high kinetic inductance material, and control lines may also be coupled to compound Josephson junction 406 and may be formed from the same or a different material from superconducting device 402. Superconducting device 402 may be formed within one layer of high kinetic inductance material, for example, WSi, MoN, NbN, NbTiN, TiN, and granular Aluminum, as discussed above. The use of only one layer to form superconducting device 402 may beneficially simplify fabrication and reduce the volume occupied by device 402 within the processor. Device 402 may be formed by electron beam lithography, sputtering, electron beam evaporation, thermal evaporation, vapor deposition, vacuum evaporation, electron beam masking, photolithography, liftoff masking, etching, or other cutting and patterning methods and may be deposited or polished to form a substantially planar layer.

It will be understood that device 402 may be placed over other structures including other wiring layers and/or dielectric layers and may not be placed directly on substrate 404. Substrate 404 may be formed of silicon, sapphire, quartz, silicon dioxide, or any other suitable material. Device 402 has a loop of material within compound Josephson junction 406 that carries the electrical couplings between the loop of material and the power line and is interrupted by a pair of Josephson junctions, as discussed above. Device 402 also has an energy storage element 408 connected to the loop of material, which as shown and discussed above may take the form of another loop of material that carries a coupling element.

Figure 4B:
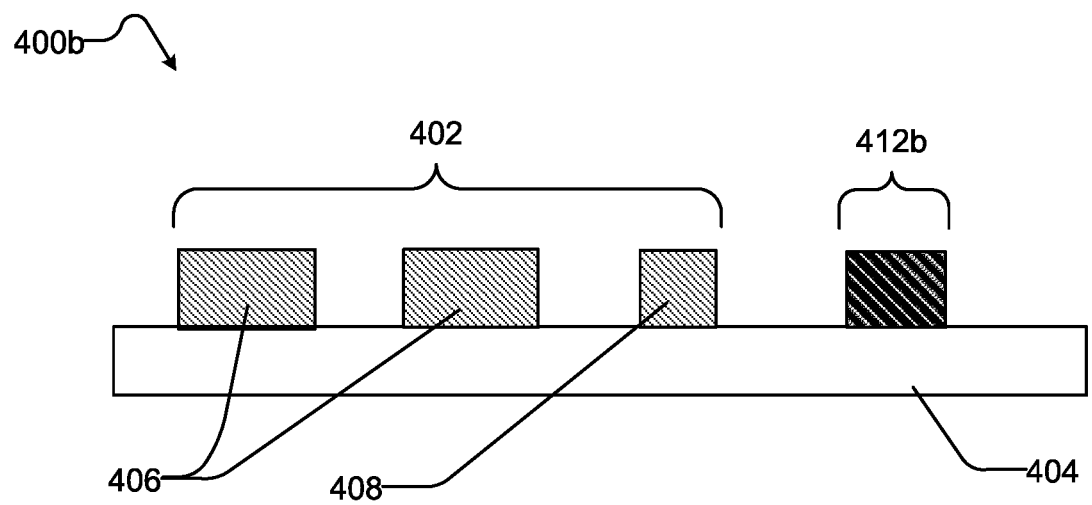
FIG. 4B is a sectional view of a portion of a superconducting integrated circuit including a one kinetic inductance layer DAC and a one layer qubit.

Referring to FIG. 4B, in some implementations, superconducting device 402 is a control device 402, and a controllable device 412b may also be formed on substrate 404. Controllable device 412b may be a qubit, or controllable device 412b may take the form of a variety of different devices, as will be discussed further below. Controllable device 412b may also be formed by electron beam lithography, vapor deposition, vacuum evaporation, and other cutting and patterning methods and may be deposited or polished to form a substantially planar layer. In some implementations, control device 402 may be deposited and patterned, and then may be covered with an insulating material to allow for controllable device 412b to be deposited. The insulating material may then be removed to yield a processor circuit having different components deposited directly on substrate 404. In some implementations, controllable device 412b may be formed from the same high kinetic inductance material as device 402, and may be formed at the same time, or controllable device 412b may be formed from an additional high kinetic inductance material, for example, WSi, MoN, NbN, NbTiN, TiN, and granular Aluminum. In other implementations, controllable device 412b may be formed from a superconducting material that does not have high kinetic inductance, for example, Nb or Al. In some implementations, it may be beneficial to provide control device 402 from a high kinetic inductance material, and controllable device 412b from a low kinetic inductance material, for example, where control device 402 is a DAC that programs a qubit, and controllable device 412b is a qubit.

Figure 4C:
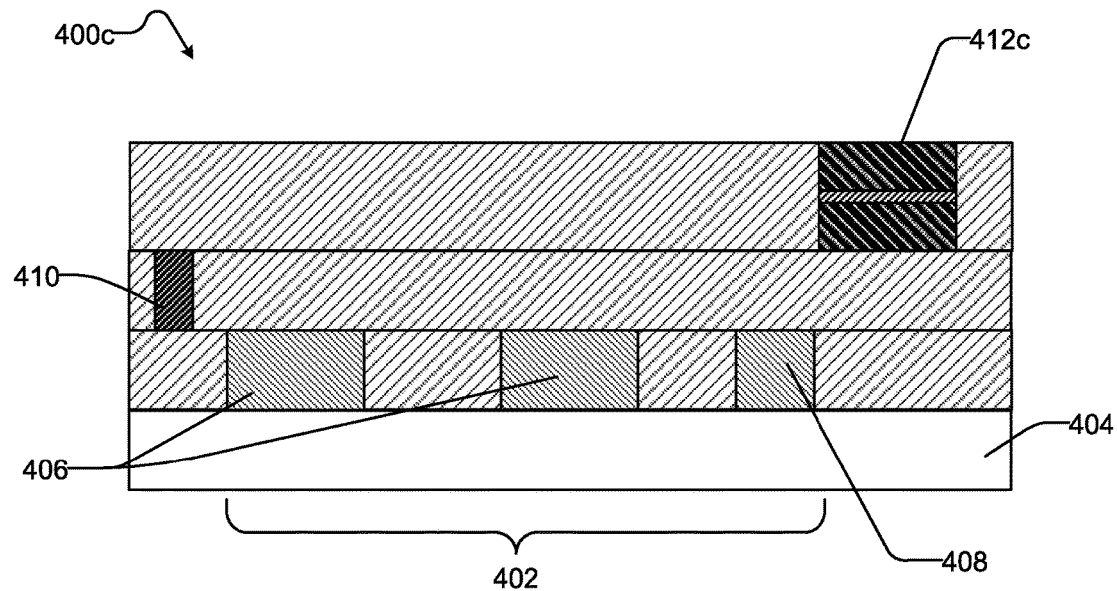
FIG. 4C is a sectional view of a portion of a superconducting integrated circuit including a DAC, a control line, and a trilayer Josephson junction.

Referring to FIG. 4C, additional layers may be formed above or below control device 402 as part of integrated circuit 400c. In the implementation shown in FIG. 4C, a control line 410 is provided. Control line 410 may be formed of a high kinetic inductance material, or it may be formed from another superconducting material. Multiple control lines may be provided. In some implementations there may be two control lines provided, and these two control lines and the power line may be addressable by a triplet of signals. The control lines may be used to store a desired number of flux quanta in control device 402. The implementation shown in FIG. 400c also shows a controllable device 412c in the form of a trilayer Josephson Junction that may be a component of a qubit. It will be understood that controllable device 412c may be formed in the same layer as control device 402 or control line 410, and the relative positions of each component within the stack may be varied. Controllable device 412c may be coupled to the coupling element of control device 402 through broadside (within the same layer) coupling or stacked (between different layers) coupling, depending on the arrangement of components.

Figure 4D:
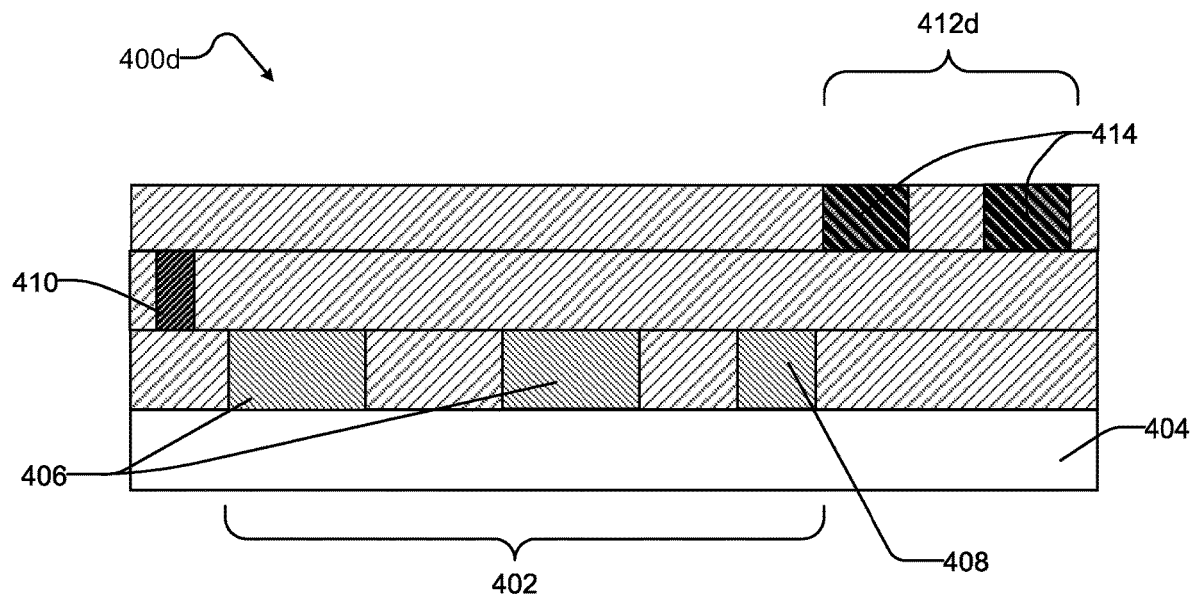
FIG. 4D is a sectional view of a portion of a superconducting integrated circuit including a DAC, a control line, and a qubit.

Referring to FIG. 4D, controllable device 412d (shown here in cross-section) may be formed by a second layer of high kinetic inductance material. In order to provide sufficient current in each of control device 402 and controllable device 412d, the second layer of high kinetic inductance material may have a thickness that is less than the thickness of the first layer of high kinetic inductance material that forms control device 402. In the example implementation of FIG. 4D, controllable device 412d includes a loop 414 making up a portion of a qubit. Controllable device 412d may be formed in one or more layers, and all or a portion of controllable device 412d may be formed from a high kinetic inductance material.

Figure 4E:
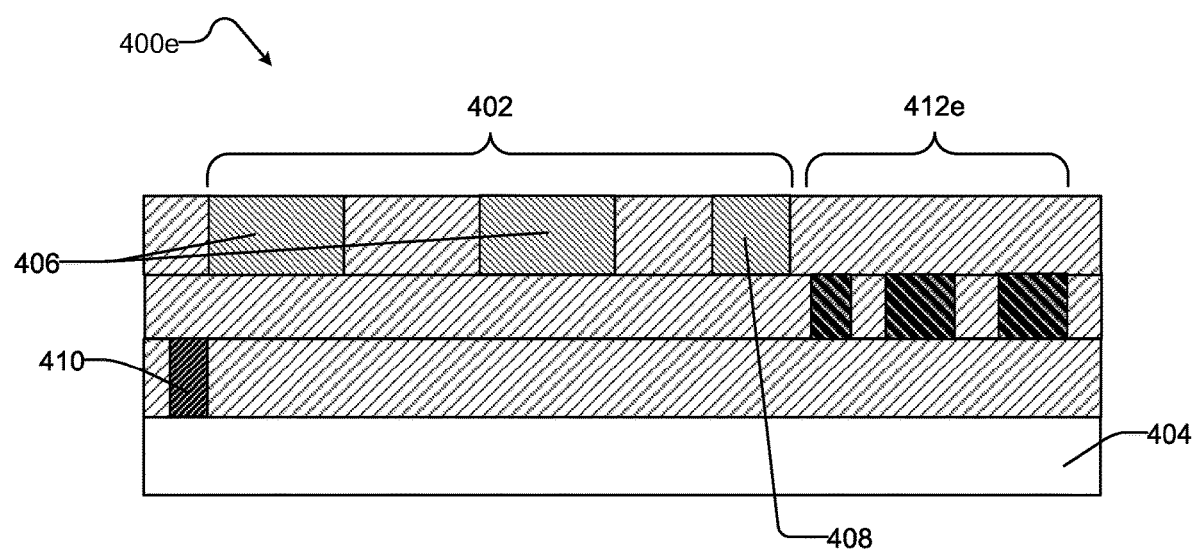
FIG. 4E is a sectional view of a portion of a superconducting integrated circuit including a second implementation of a DAC, a control line, and a qubit.

FIG. 4E shows a superconducting integrated circuit 400e that is similar to superconducting integrated circuit 400d, with the order of the layers changed. It will be understood that different numbers of layers may be included in the superconducting integrated circuit, and overlying layers may be placed directly on top of one another or may have one or more intervening layers separating them. Controllable device 412e may be a qubit formed entirely of a high kinetic inductance material, and the depicted controllable device 412e may be a cross-section of a device similar to device 602 shown in FIG. 6.

In some implementations the superconducting integrated circuit may have a plurality of programmable devices, for example, a plurality of superconducting qubits and one or more couplers for communicatively coupling the superconducting qubits, one implementation of which was discussed with respect to the circuit of FIG. 2. It will be understood that similar integrated circuits to those shown in FIGS. 4B, 4C, 4D, and 4E may be formed for a plurality of programmable devices, and the controllable device will be a target device of this plurality of programmable devices, for example, a selected qubit or coupler.

Figure 5:
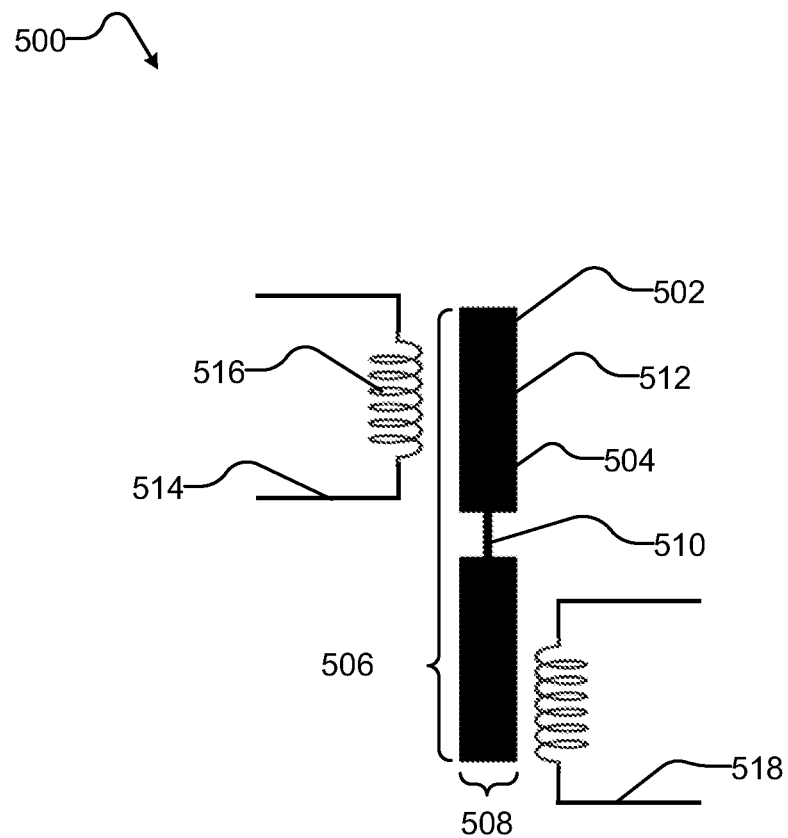
FIG. 5 is a schematic diagram of an implementation of a qubit.
Figure 6:
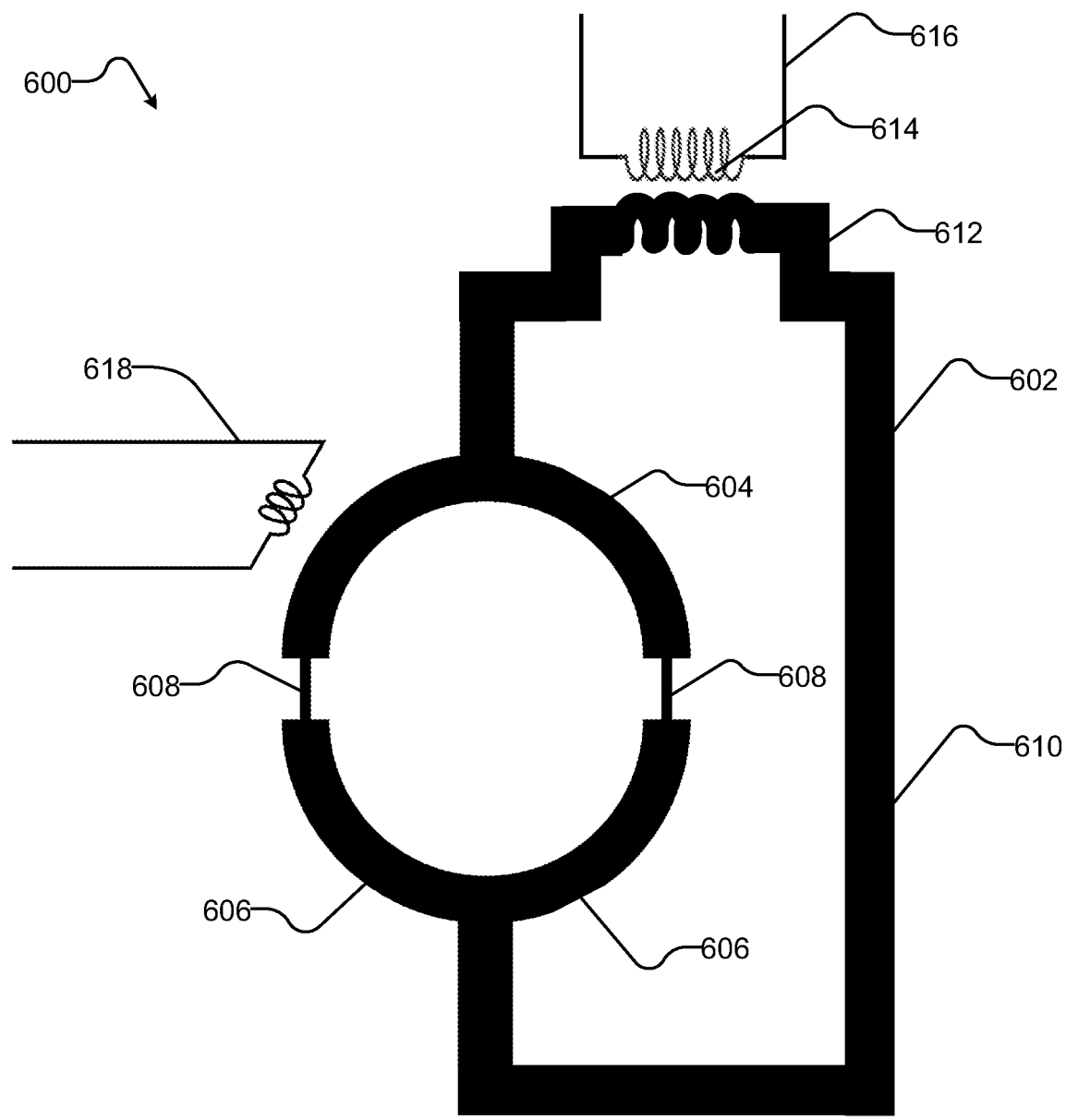
FIG. 6 is a schematic diagram of a second implementation of a qubit.
Figure 7:
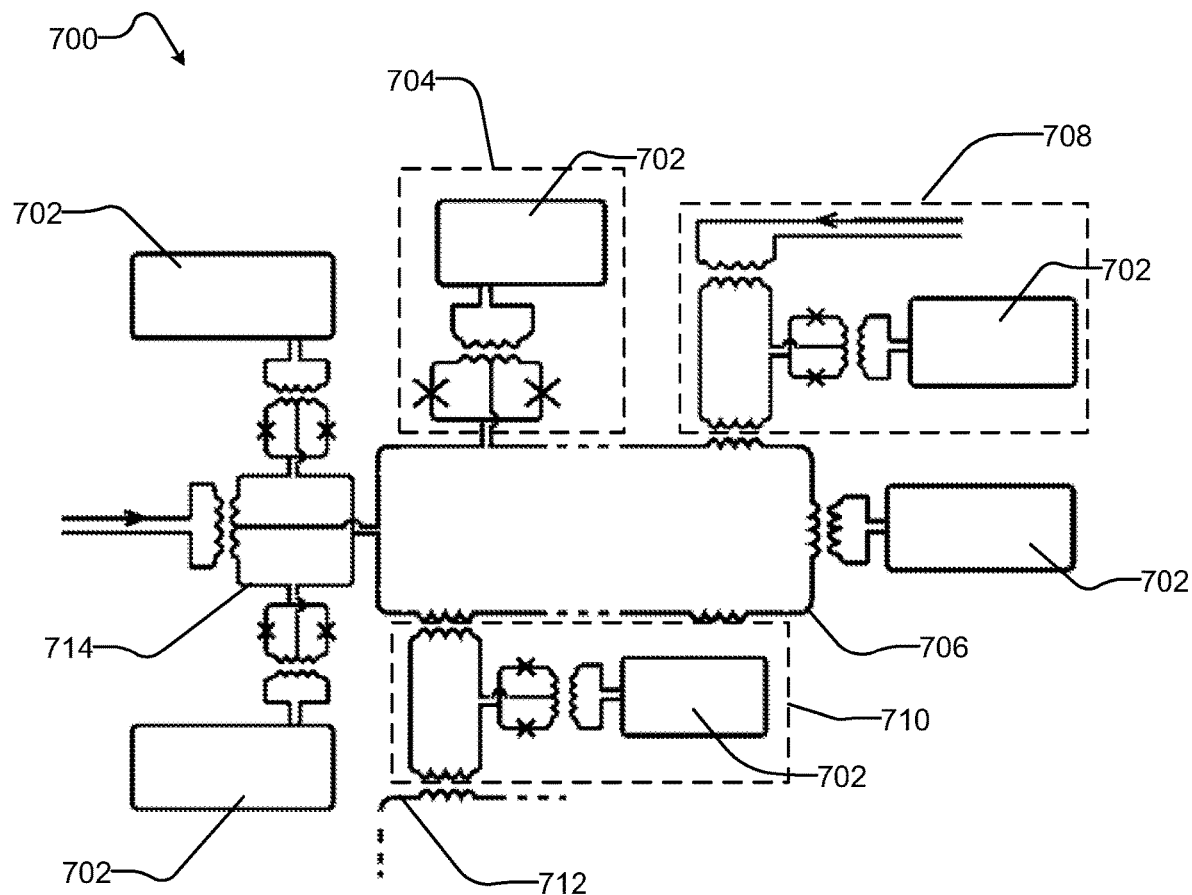
FIG. 7 is a schematic diagram of a portion of a superconducting processor.
Figure 9:
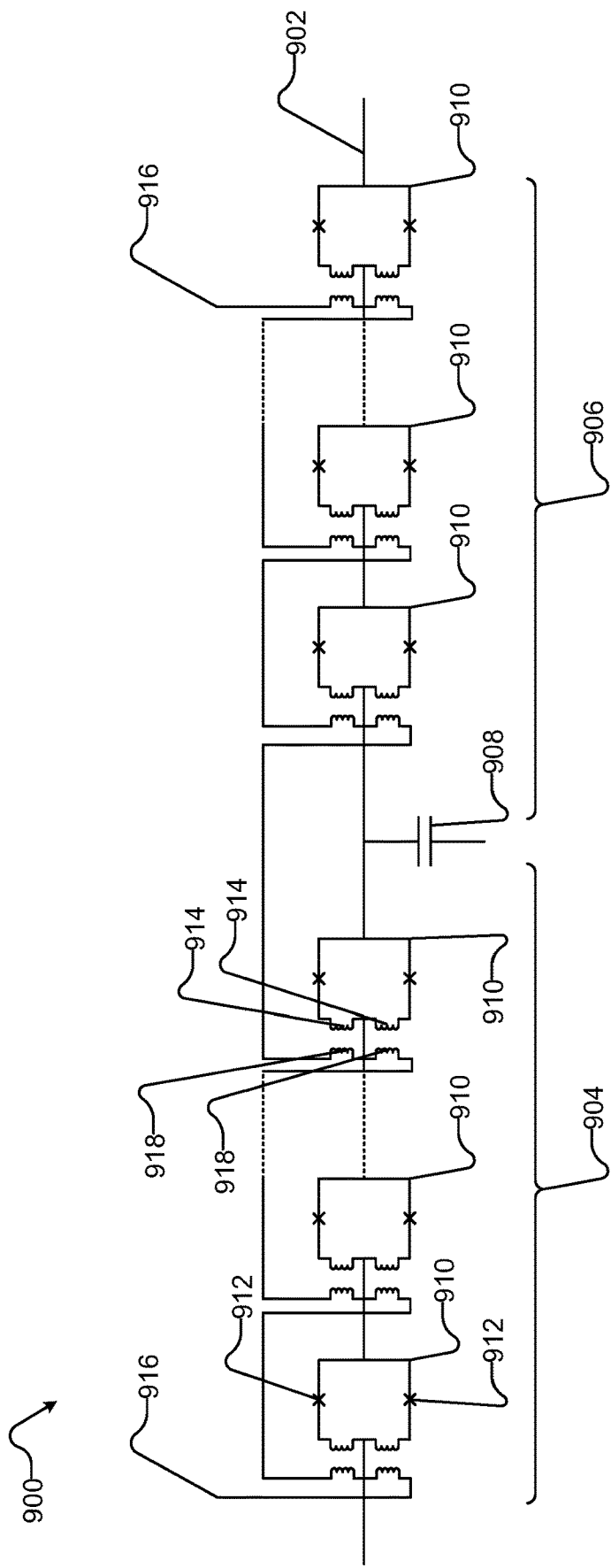
FIG. 9 is a schematic diagram of an example implementation of a single cascade element.
Figure 10:
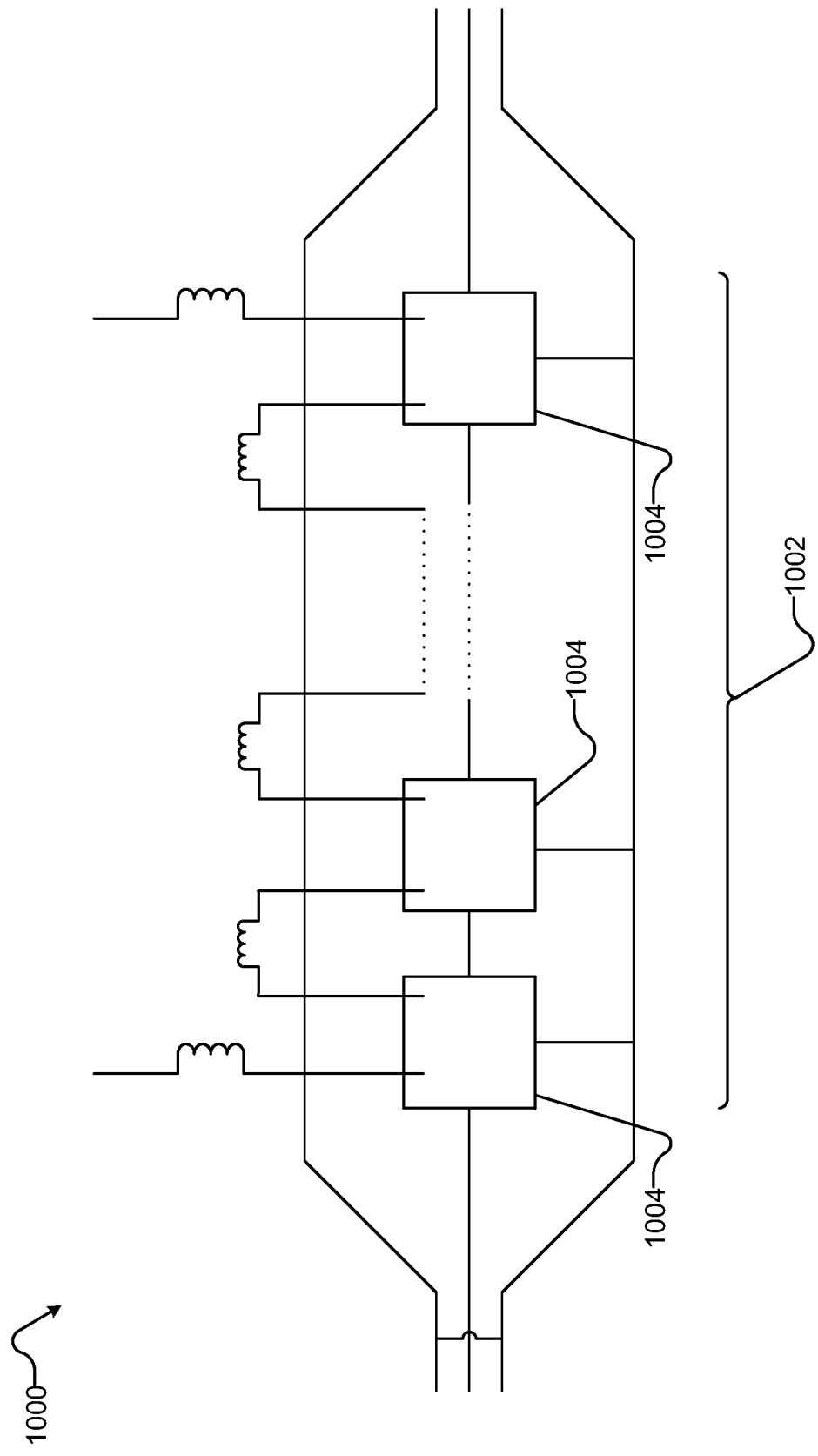
FIG. 10 is a schematic diagram of an example implementation of a transmission line layout with N cascade elements.

In some implementations devices other than DACs may be formed from high kinetic inductance material. Referring to FIG. 5 and FIG. 6, a qubit may be formed from high kinetic inductance material. Referring to FIG. 7, an L-tuner, as well as other devices, may be formed from high kinetic inductance material. Referring to FIGS. 9 and 10, a SQUID (superconducting quantum interference device) switch may also be formed from high kinetic inductance material.

Qubits

In the implementation described above, the kinetic inductance device may be a digital to analog converter. In other implementations, the kinetic inductance device may be a qubit.

Referring to FIG. 5, superconducting integrated circuit 500 has a kinetic inductance device 502 in the form of a superconducting qubit formed in a high kinetic inductance layer. As defined above, high kinetic inductance material may be a superconducting material in which at least 10% of the energy stored is stored as kinetic inductance, or where the kinetic inductance fraction of the high kinetic inductance material is $0.1 < \alpha \le 1$. In some implementations the high kinetic inductance material may be one of WSi, MoN, NbN, NbTiN, TiN, and granular Aluminum.

Qubit 502 has a body portion 504 with a length 506 and a width 508. A Josephson junction 510 interrupts the body portion and is spaced along length 506 of body portion 504. Josephson junction 510 is a restriction having a width that is less than width 508 of body portion 504. Qubit 502 has a first coupling structure 512, which in the example implementation of FIG. 5 is a region of body portion 504 that couples to an additional device 514 having a second coupling structure 516 that couples additional device 514 to coupling structure 512 of kinetic inductance device 502.

Superconducting integrated circuit 500 may have one or more additional components, for example, transmission line 518, in communication with qubit 502. While the circuit in FIG. 5 is an implementation with additional device 514 and transmission line 518 inductively coupled, it will be understood that these devices, as well as any other circuit components, may be capacitively coupled. In one implementation, 518 may be a transmission line that is capacitively coupled to qubit 502. In another implementation, 516 may be a control DAC, which may be coupled to a close loop instead of through broadside coupling as shown. It will be understood that a combination of inductive and capacitive coupling may also be used.

In the example implementation of FIG. 5, qubit 502 has one Josephson junction. In other implementations, for example where it is desired to form a flux qubit, a superconducting integrated circuit may have a qubit with a more complex layout. In one implementation, as shown in FIG. 6, superconducting integrated circuit 600 has a kinetic inductance device 602 in the form of a superconducting qubit formed in a high kinetic inductance layer as discussed above. Qubit 602 has a compound Josephson junction structure 604 with two parallel current paths 606 containing respective Josephson junction structures 608. A loop of material 610 is connected to compound Josephson junction structure 604. A portion of loop of material 610 acts as a first coupling structure 612 to couple with second coupling structure 614 of additional device 616. It will be understood that a portion of compound Josephson junction structure 604 may also act as first coupling structure 612. As discussed above, additional device 616 may be formed in the same layer or a different layer from qubit 602. A control line 618 or control device may be coupled to compound Josephson junction structure 604, and/or one or more control lines or devices may be coupled to other portions of device 602. In some implementations, control line 618 may be a bias line that communicates with compound Josephson junction structure 604.

L-Tuners

Inductance is a parameter within a superconducting integrated circuit that may undesirably vary from device to device as a result of fabrication variations. For example, the qubits of a quantum computing processor may have qubit inductances that vary from qubit to qubit. The inductance of each qubit may also depend, at least in part, on the programmed configuration of the quantum processor, and these inductances can change as the configuration of the quantum processor is reprogrammed. As such, quantum processors may include L-tuners for actively compensating for discrepancies in the qubit inductance of each qubit (or a subset of qubits) or the inductance of other devices. L-tuner structures may be coupled to a qubit loop or a compound Josephson junction structure. Multiple L-tuner structures may be used in association with one qubit or other device. In some implementations, where there are multiple L-tuner structures coupled to multiple couplers that are coupled to a qubit, L-tuners may also be used to compensate the load presented by each coupler at the setting used to run a problem. As such, L-tuners may be used to compensate for variation in inductance of qubits both due to fabrication variation and due to coupler loading variation. Further details of L-Tuners can be found in U.S. Pat. No. 8,536,566.

SQUID Switches

In some quantum processors, switches may be used for dynamically isolating one or more devices, which may beneficially reduce noise reaching the one or more devices. FIG. 9 is a schematic diagram of an example implementation of a single cascade element 900 for use in a switch for dynamically isolating one or more devices. Cascade element 900 may be used as one of a plurality of cascade of elements as part of a broadband switch to dynamically isolate a device, such as a superconducting processor. While the general structure and function of cascade element 900 is described in detail in U.S. Patent Application Publication No. 2019/0369171, the structure illustrated and described herein advantageously employs a kinetic inductance layer. The switch that comprises cascade elements 900 is referred to herein as a SQUID switch, and may also be referred to as a broadband switch.

Cascade element 900 has a transmission line 902, a first segment 904 and a second segment 906, where first segment 904 is on the left-hand side (in the view of the drawing) of a matching capacitor 908 and second segment 906 is on the right-hand side (in the view of the drawing). First and second segments 904, 906 comprise DC-SQUIDs 910. Each DC-SQUID 910 has a pair of Josephson junctions 912 (only one pair called out to reduce clutter) and a pair of couplers 914 (only one pair called out to reduce clutter). Activation lines 916 are inductively coupled to couplers 914 by second couplers 918 (only one pair called out to reduce clutter) and are operable to cause the state of cascade element 900 to change from a suppression state to a passing state, and vice versa, when used as part of a broadband switch for dynamic isolation of a device, such as a superconducting processor. In the implementation of FIG. 9, couplers 914 and 918 are elements of an inductively coupled transformer, with coupler 918 being the primary winding and coupler 914 being the secondary winding of each inductively coupled transformer.

Cascade element 900 may be formed with a first kinetic inductance layer of high kinetic inductance material forming DC-SQUIDs 910, with Josephson junctions 912 and first couplers 914 formed in the high kinetic inductance material as discussed above. Activation lines 916 may be formed as additional devices that may be in the same layer or in a separate layer or layers with second couplers 918 coupling to the first couplers 914 of device 910. Using only one layer of kinetic inductance material may be beneficial to simplify the layout and processing of cascade element 900, allowing the wiring (e.g., DC-SQUIDs 910), transformers (e.g., couplers 914), and junctions (e.g., Josephson junctions 912) to be formed with a single high kinetic inductance layer.

FIG. 10 is a schematic diagram of an example implementation of a transmission line layout 1000 that may be used for dynamically isolating a device, such as a superconducting processor. Transmission line 1000 comprises a broadband switch 1002 (referred to herein as a SQUID switch) with cascade elements 1004 electrically coupled in series. Each cascade element 1004 may be implemented as cascade element 900 of FIG. 9. While the general structure and function of transmission line layout 1000 is described in detail in U.S. Patent Application Publication No. 2019/0369171, the structure illustrated and described herein advantageously employs a kinetic inductance layer. In one implementation, SQUID switch 1002 may be used as part of a superconducting circuit comprising microwave paths, as described in U.S. Patent Application No. 62/672,392.

Critical Current Variations

Within a superconducting integrated circuit for a quantum processor, different components may have different operating current requirements. The current that can be processed through a given kinetic inductance material will be governed by the nature of the material and the width and thickness of the material.

The critical current ($I_C$) of the circuit is related to both the thickness and the width of the line forming the component. In some implementations, the $I_C$ required for the DACs and the L-tuners in the quantum processor is large relative to the rest of the system (for example relative to the qubits). In contrast, a significantly lower $I_C$ may be required for operation of components including the qubits and the control lines. As discussed above, it may be possible to form the DACs, the L-tuners, the control lines, and the controlled devices including qubits and couplers all from the same layer of high kinetic inductance material. However, in some implementations it may be beneficial to form components requiring relatively large $I_C$, for example DACs, in one layer, and components requiring smaller $I_C$, for example qubits, in another layer. This may allow for different layer thicknesses or the use of different high kinetic inductance materials such that the relative width of the components need not be the only factor controlling the $I_C$. In some implementations, the high kinetic inductance materials may include WSi, MoN, NbN, NbTiN, TiN, and granular Aluminum. For example, the high kinetic inductance layer that contains the DACs may be formed from granular Aluminum, while the high kinetic inductance layer that contains the qubits may be formed from NbN. In another example, granular Aluminum may be used for both layers, but the current density of the layers may differ, as the current density of the granular Aluminum may be controlled through oxidation.

The choice of high kinetic inductance material may also be varied to accommodate fabrication constraints, for example, circuit footprint. In the implementation shown in FIG. 3, the main structure of the DAC 302 is formed from wide lines providing relatively high $I_C$. In contrast, the control lines 320 are shown as being formed from thin lines. However, in some implementations, the specifications on the $I_C$ of the control lines may be such that in order to provide sufficiently high $I_C$ to perform programming, if these control lines were formed from the same high kinetic inductance material as DAC 302, the control lines would also be wide lines. In some implementations, the control lines may be formed in a separate layer of a material that provides the required $I_C$ with thin lines. In some implementations, these wiring layers may include niobium, aluminum, or a combination thereof.

Multiple Component Circuit

In the implementation shown in FIG. 7, superconducting integrated circuit 700 has multiple components. It will be understood that components throughout a superconducting integrated circuit may be formed from one high kinetic inductance layer, and the kinetic inductance device may be a qubit, an inductance tuner, a coupler, a digital to analog converter, or any other component requiring high kinetic inductance and including a Josephson junction. Superconducting integrated circuit 700 has multiple DACs 702, which may take a similar form to the DAC shown in FIG. 3 and discussed in detail above. In some implementations, a kinetic inductance device formed in a layer of high kinetic inductance material may act to tune the inductance of another component within superconducting integrated circuit 700, thereby acting as an L-tuner. In the example implementation of FIG. 7, L-tuner 704 may be a kinetic inductance device formed in one layer of high kinetic inductance material that acts to tune the inductance of an additional device. In this implementation, the additional device is a qubit 706. Superconducting integrated circuit 700 includes a persistent current (Ip) compensator 708 and a coupler 710. Coupler 710 couples to a second qubit 712, only a portion of which is shown. Qubit 706 includes a compound compound Josephson junction structure at 714. It will be understood that any of the structures within superconducting integrated circuit 700 may be formed from one layer of high kinetic inductance material as discussed herein. These devices may be formed in the same layer of high kinetic inductance material, or may be formed in distinct kinetic inductance layers, allowing for the inductance and physical parameters of each component to be selected separately. This may allow for variations in critical current for different devices, as discussed above. In some implementations a first kinetic inductance layer is formed, and an additional layer includes a second layer of high kinetic inductance material having a thickness that is less than the thickness of the first kinetic inductance layer.

Method

Figure 8:
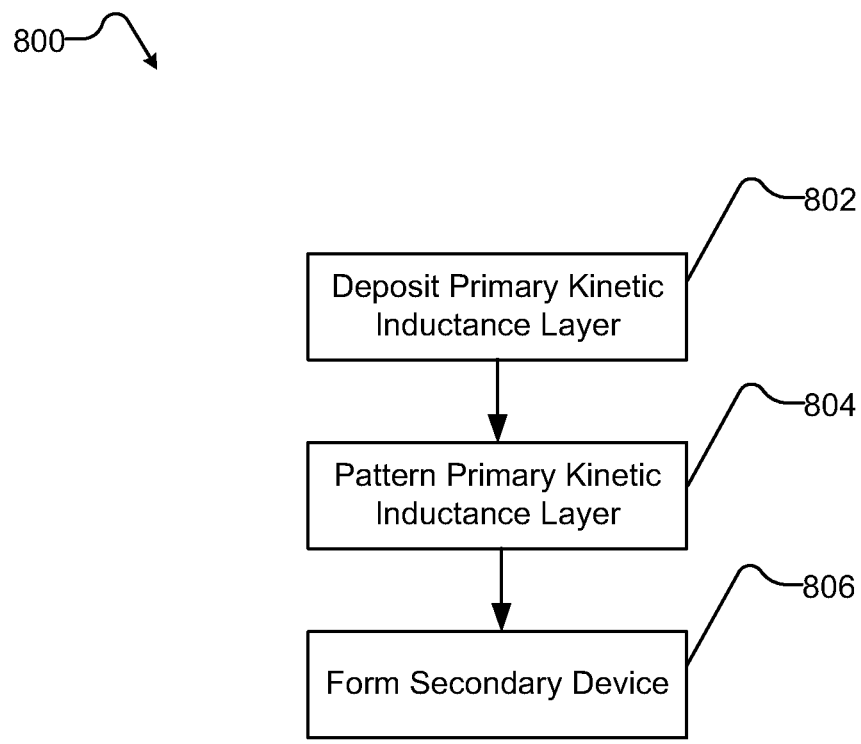
FIG. 8 is a flowchart illustrating a method for fabricating a superconducting integrated circuit.

FIG. 8 is a flow chart illustrating a method 800 for forming a superconducting integrated circuit in accordance with the present systems and methods. Method 800 includes acts 802-806, although in other implementations certain acts may be omitted, additional acts may be added, and/or the acts may be performed in different orders. Method 800 may be performed by, for example, integrated circuit fabrication equipment in response to an initiation of a fabrication process.

At 802, a first kinetic inductance layer is deposited directly or indirectly overlying a substrate. The first kinetic inductance layer is formed from a high kinetic inductance material as discussed above and may be deposited by electron beam lithography, vapor deposition, vacuum evaporation, and other cutting and patterning methods. In some implementations the first kinetic inductance layer may be deposited directly on the substrate, and in other implementations the first kinetic inductance layer may overlie other components of the superconducting integrated circuit.

At 804, the first kinetic inductance layer is patterned to form a kinetic inductance device. The kinetic inductance device has a compound Josephson junction structure comprising two parallel current paths with respective Josephson junction structures, a loop of material connected to the compound Josephson junction structure, and a first coupling structure. In some implementations, as discussed above, the first kinetic inductance layer may be patterned to form one of a qubit, an inductance tuner, and a digital to analog converter.

It will be understood that the order of acts 802 and 804 may be varied in other implementations. In one implementation, the first kinetic inductance layer may be deposited and patterned with a liftoff method. A resist layer may be applied to the surface and may be patterned, and then the high kinetic inductance material may be deposited such that the openings formed in the resist receive the high kinetic inductance material to form the kinetic inductance device. A solvent may then be used to remove the resist. As such, it will be understood that the method may first proceed with act 804 by forming a pattern for the first kinetic inductance layer in a resist layer, and then with act 802 by depositing the high kinetic inductance material.

At 806, a second device is formed directly or indirectly overlying the substrate such that the second device is coupled to the first coupling structure. The second device may be formed directly on the substrate, or it may be formed over the kinetic inductance device, other components of the superconducting integrated circuit, and/or one or more layers of dielectric. In some implementations the second device is formed to be a qubit. In some implementations, forming a second device may involve depositing one or more second layers, at least one of which is superconducting material, directly or indirectly overlying the substrate, and patterning the one or more second layers to form the at least one second device. This may include depositing a second layer of high kinetic inductance material having a thickness that is less than the thickness of the first kinetic inductance layer. In some implementations the second device is formed directly or indirectly overlying the substrate and the first kinetic inductance layer, and in other implementations the first kinetic inductance layer may be deposited directly or indirectly over the substrate and the second device.

The above described method(s), process(es), or technique(s) could be implemented by a series of processor readable instructions stored on one or more nontransitory processor-readable media. Some examples of the above described method(s), process(es), or technique(s) method are performed in part by a specialized device including an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 7,533,068, 7,876,248, 8,008,942, 8,098,179, 8,190,548, 8,195,596, 8,421,053, 8,536,566, and 8,951,808, U.S. Patent Application Publication Nos. 2018/0101786 and 2019/0369171, U.S. patent application Ser. Nos. 16/098,801, 16/481,788, 62/672,392, 62/850,309, and 63/023,048, and International (PCT) Publication Nos. WO2010/028183, WO2012/064974, and WO 2019/222514.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A superconducting integrated circuit comprising:
a first kinetic inductance layer comprising high kinetic inductance material, the first kinetic inductance layer comprising a kinetic inductance device, the kinetic inductance device comprising:
a body portion comprising a length and a width;
a Josephson junction interrupting the body portion spaced along the length of the body portion, the Josephson junction comprising a restriction having a width that is less than the width of the body portion; and
a first coupler; and the superconducting integrated circuit further comprising:
an additional device comprising a second coupler that couples the additional device to the first coupler of the kinetic inductance device.

2. The superconducting integrated circuit of claim 1, wherein the body portion comprises a compound Josephson junction structure comprising two parallel current paths interrupted by respective Josephson junctions, each Josephson junction comprising a restriction in the high kinetic inductance material of the first kinetic inductance layer.

3. The superconducting integrated circuit of claim 2, wherein the kinetic inductance device further comprises an energy storage element that extends from the compound Josephson junction structure.

4. The superconducting integrated circuit of claim 1, wherein the kinetic inductance device comprises one of a qubit, an inductance tuner, a coupler, a superconducting quantum interference device (SQUID) switch, and a digital to analog converter.

5. The superconducting integrated circuit of claim 1, wherein the additional device comprises a qubit.

6. The superconducting integrated circuit of claim 1, wherein the superconducting integrated circuit comprises one or more additional layers that are distinct from the first kinetic inductance layer, the one or more additional layers comprising the additional device.

7. The superconducting integrated circuit of claim 6, wherein the one or more additional layers are in one or more separate planes from a plane in which the first kinetic inductance layer resides.

8. The superconducting integrated circuit of claim 7, wherein the one or more additional layers comprise a second layer of high kinetic inductance material having a thickness that is less than the thickness of the first kinetic inductance layer.

9. A method of forming a superconducting integrated circuit comprising:
forming a kinetic inductance device in a first kinetic inductance layer, the first kinetic inductance layer comprising a high kinetic inductance material, the kinetic inductance device comprising:
a body portion comprising a length and a width;
a Josephson junction interrupting the body portion spaced along the length of the body portion, the Josephson junction comprising a restriction having a width that is less than the width of the body portion; and
a first coupling structure; and the method further comprising:
forming a second device such that the second device is coupled to the first coupling structure.

10. The method of claim 9, wherein forming a kinetic inductance device includes:
depositing the first kinetic inductance layer to directly or indirectly overlie at least a portion of a substrate; and then
patterning the first kinetic inductance layer.

11. The method of claim 9, wherein forming a kinetic inductance device includes:
depositing a resist layer to overlie a substrate;
patterning the resist layer;
depositing the first kinetic inductance layer after patterning the resist layer; and
removing at least a portion of the resist layer after depositing the first kinetic inductance layer.

12. The method of claim 9, wherein forming the kinetic inductance device comprises forming the kinetic inductance device having a compound Josephson junction structure comprising two parallel current paths interrupted by respective Josephson junctions, each Josephson junction comprising a restriction in the high kinetic inductance material of the first kinetic inductance layer.

13. The method of claim 12, wherein forming the kinetic inductance device further comprises forming an energy storage element extending from the compound Josephson junction structure.

14. The method of claim 9, wherein forming the kinetic inductance device comprises forming one of a qubit, an inductance tuner, a coupler, a superconducting quantum interference device (SQUID) switch, and a digital to analog converter.

15. The method of claim 9, wherein forming the second device comprises forming a qubit.

16. The method of claim 9, wherein forming the second device comprises:
depositing one or more second layers directly or indirectly overlying at least a portion of a substrate, at least one of the one or more second layers comprising a superconducting material; and
patterning the one or more second layers to form the second device.

17. The method of claim 13, wherein depositing one or more second layers comprises depositing a second layer of high kinetic inductance material having a thickness that is less than the thickness of the first kinetic inductance layer.

18. The method of claim 9, wherein forming the kinetic inductance device comprises forming the kinetic inductance device directly or indirectly overlying at least a portion of a substrate.

19. The method of claim 18, wherein forming a first kinetic inductance layer directly or indirectly overlying at least a portion of the substrate comprises depositing the first kinetic inductance layer directly on the substrate, and wherein forming a second device comprises forming the second device directly on the substrate.

20. The method of claim 9, wherein forming a second device comprises forming the second device directly or indirectly overlying at least a portion of the first kinetic inductance layer.

21. The method of claim 9, wherein forming a kinetic inductance device in a first kinetic inductance layer comprises forming the kinetic inductance device directly or indirectly overlying at least a portion of the second device.

* * * * *